(12) United States Patent
Tsai et al.

(10) Patent No.: US 11,956,560 B2
(45) Date of Patent: Apr. 9, 2024

(54) DIGITAL PIXEL SENSOR HAVING REDUCED QUANTIZATION OPERATION

(71) Applicant: META PLATFORMS TECHNOLOGIES, LLC, Menlo Park, CA (US)

(72) Inventors: Tsung-Hsun Tsai, Redmond, CA (US); Song Chen, Redmond, CA (US); Xinqiao Liu, Medina, WA (US)

(73) Assignee: Meta Platforms Technologies, LLC, Menlo Park, CA (US)

( * ) Notice: Subject to any disclaimer, the term of this patent is extended or adjusted under 35 U.S.C. 154(b) by 0 days.

(21) Appl. No.: 17/496,712

(22) Filed: Oct. 7, 2021

(65) Prior Publication Data

US 2022/0116565 A1    Apr. 14, 2022

Related U.S. Application Data

(60) Provisional application No. 63/089,704, filed on Oct. 9, 2020.

(51) Int. Cl.
*H04N 5/3745* (2011.01)
*H03M 1/56* (2006.01)
(Continued)

(52) U.S. Cl.
CPC ............ *H04N 25/772* (2023.01); *H03M 1/56* (2013.01); *H04N 25/59* (2023.01); *H04N 25/709* (2023.01);
(Continued)

(58) Field of Classification Search
CPC ............. H04N 5/37455; H04N 5/3559; H04N 5/3698; H04N 5/37452; H04N 5/37457;
(Continued)

(56) References Cited

U.S. PATENT DOCUMENTS

| 4,596,977 A | 6/1986 | Bauman et al. |
| 5,053,771 A | 10/1991 | McDermott |

(Continued)

FOREIGN PATENT DOCUMENTS

| CN | 1490878 A | 4/2004 |
| CN | 1728397 A | 2/2006 |

(Continued)

OTHER PUBLICATIONS

Corrected Notice of Allowance dated Mar. 7, 2022 for U.S. Appl. No. 17/150,925, filed Jan. 15, 2021, 2 Pages.
(Continued)

*Primary Examiner* — Lin Ye
*Assistant Examiner* — Chan T Nguyen
(74) *Attorney, Agent, or Firm* — Kilpatrick Townsend & Stockton LLP

(57) ABSTRACT

In some examples, a sensor apparatus comprises: a pixel cell configured to generate a voltages, the pixel cell including a photodiode configured to generate charge in response to incoming light, and a charge storage device to convert the charge to a voltage; an integrated circuit configured to: determine a first captured voltage converted by the charge storage device during a first time period; compare the first captured voltage to a threshold voltage value; and in response to determining that the first captured voltage meets or exceeds the threshold voltage value: determine first time data corresponding to the first time period; and prevent the charge storage device from further generating a charge; and an analog-to-digital converter (ADC) configured to generate a digital pixel value based on the first captured voltage, and a memory to store the digital pixel value and the first time data.

20 Claims, 16 Drawing Sheets

(51) Int. Cl.
  *H04N 5/355* (2011.01)
  *H04N 5/369* (2011.01)
  *H04N 25/59* (2023.01)
  *H04N 25/709* (2023.01)
  *H04N 25/771* (2023.01)
  *H04N 25/772* (2023.01)
  *H04N 25/778* (2023.01)

(52) U.S. Cl.
  CPC ......... *H04N 25/771* (2023.01); *H04N 25/778* (2023.01)

(58) Field of Classification Search
  CPC .. H04N 5/379; H04N 5/3745; H04N 5/35545; H04N 5/35554; H04N 5/378; H03M 1/56; H03M 1/123; H03M 1/1295
  USPC ....................................................... 348/302
  See application file for complete search history.

(56) References Cited

U.S. PATENT DOCUMENTS

| | | | |
|---|---|---|---|
| 5,650,643 A | 7/1997 | Konuma | |
| 5,844,512 A | 12/1998 | Gorin et al. | |
| 5,963,369 A | 10/1999 | Steinthal et al. | |
| 6,181,822 B1 | 1/2001 | Miller et al. | |
| 6,384,905 B1 | 5/2002 | Barrows | |
| 6,522,395 B1 | 2/2003 | Bamji et al. | |
| 6,529,241 B1 | 3/2003 | Clark | |
| 6,864,817 B1 | 3/2005 | Salvi et al. | |
| 6,963,369 B1 | 11/2005 | Olding | |
| 7,326,903 B2 | 2/2008 | Ackland | |
| 7,362,365 B1 | 4/2008 | Reyneri et al. | |
| 7,659,772 B2 | 2/2010 | Nomura et al. | |
| 7,659,925 B2 | 2/2010 | Krymski | |
| 7,719,589 B2 | 5/2010 | Turchetta et al. | |
| 7,880,779 B2 | 2/2011 | Storm | |
| 7,956,914 B2 | 6/2011 | Xu | |
| 8,134,623 B2 | 3/2012 | Purcell et al. | |
| 8,144,227 B2 | 3/2012 | Kobayashi | |
| 8,369,458 B2 | 2/2013 | Wong et al. | |
| 8,426,793 B1 | 4/2013 | Barrows | |
| 8,754,798 B2 | 6/2014 | Lin | |
| 8,773,562 B1 | 7/2014 | Fan | |
| 8,779,346 B2 | 7/2014 | Fowler et al. | |
| 8,946,610 B2 | 2/2015 | Iwabuchi et al. | |
| 9,001,251 B2 | 4/2015 | Smith et al. | |
| 9,094,629 B2 | 7/2015 | Ishibashi | |
| 9,185,273 B2 | 11/2015 | Beck et al. | |
| 9,274,151 B2 | 3/2016 | Lee et al. | |
| 9,282,264 B2 | 3/2016 | Park et al. | |
| 9,332,200 B1 | 5/2016 | Hseih et al. | |
| 9,343,497 B2 | 5/2016 | Cho | |
| 9,363,454 B2 | 6/2016 | Ito et al. | |
| 9,478,579 B2 | 10/2016 | Dai et al. | |
| 9,497,396 B2 | 11/2016 | Choi | |
| 9,531,990 B1 | 12/2016 | Wilkins et al. | |
| 9,800,260 B1 | 10/2017 | Banerjee | |
| 9,819,885 B2 | 11/2017 | Furukawa et al. | |
| 9,832,370 B2 | 11/2017 | Cho et al. | |
| 9,909,922 B2 | 3/2018 | Schweickert et al. | |
| 9,948,316 B1 | 4/2018 | Yun et al. | |
| 9,955,091 B1 | 4/2018 | Dai et al. | |
| 9,967,496 B2 | 5/2018 | Ayers et al. | |
| 10,003,759 B2 | 6/2018 | Fan | |
| 10,015,416 B2 | 7/2018 | Borthakur et al. | |
| 10,090,342 B1 | 10/2018 | Gambino et al. | |
| 10,096,631 B2 | 10/2018 | Ishizu | |
| 10,154,221 B2 | 12/2018 | Ogino et al. | |
| 10,157,951 B2 | 12/2018 | Kim et al. | |
| 10,321,081 B2 | 6/2019 | Watanabe et al. | |
| 10,345,447 B1 | 7/2019 | Hicks | |
| 10,419,701 B2 | 9/2019 | Liu | |
| 10,574,925 B2 | 2/2020 | Otaka | |
| 10,594,974 B2 | 3/2020 | Ivarsson et al. | |
| 10,598,546 B2 | 3/2020 | Liu | |
| 10,608,101 B2 | 3/2020 | Liu | |
| 10,686,996 B2 | 6/2020 | Liu | |
| 10,726,627 B2 | 7/2020 | Liu | |
| 10,750,097 B2 | 8/2020 | Liu | |
| 10,764,526 B1 | 9/2020 | Liu et al. | |
| 10,804,926 B2 | 10/2020 | Gao et al. | |
| 10,812,742 B2 | 10/2020 | Chen et al. | |
| 10,825,854 B2 | 11/2020 | Liu | |
| 10,834,344 B2 | 11/2020 | Chen et al. | |
| 10,897,586 B2 | 1/2021 | Liu et al. | |
| 10,903,260 B2 | 1/2021 | Chen et al. | |
| 10,917,589 B2 | 2/2021 | Liu | |
| 10,951,849 B2 | 3/2021 | Liu | |
| 10,969,273 B2 | 4/2021 | Berkovich et al. | |
| 11,004,881 B2 | 5/2021 | Liu et al. | |
| 11,057,581 B2 | 7/2021 | Liu | |
| 11,089,210 B2 | 8/2021 | Berkovich et al. | |
| 11,595,598 B2 | 2/2023 | Liu et al. | |
| 11,595,602 B2 | 2/2023 | Gao et al. | |
| 11,729,525 B2 | 8/2023 | Liu | |
| 2002/0067303 A1 | 6/2002 | Lee et al. | |
| 2002/0113886 A1 | 8/2002 | Hynecek | |
| 2002/0118289 A1 | 8/2002 | Choi | |
| 2003/0001080 A1 | 1/2003 | Kummaraguntla et al. | |
| 2003/0020100 A1 | 1/2003 | Guidash | |
| 2003/0049925 A1 | 3/2003 | Layman et al. | |
| 2004/0090200 A1 | 5/2004 | Youm | |
| 2004/0095495 A1 | 5/2004 | Inokuma et al. | |
| 2004/0118994 A1 | 6/2004 | Mizuno | |
| 2004/0227495 A1 | 11/2004 | Egan et al. | |
| 2004/0251483 A1 | 12/2004 | Ko et al. | |
| 2005/0046715 A1 | 3/2005 | Lim et al. | |
| 2005/0057389 A1 | 3/2005 | Krymski | |
| 2005/0104983 A1 | 5/2005 | Raynor | |
| 2005/0206414 A1 | 9/2005 | Cottin et al. | |
| 2005/0231624 A1 | 10/2005 | Muramatsu et al. | |
| 2005/0237380 A1 | 10/2005 | Kakii et al. | |
| 2005/0280727 A1 | 12/2005 | Sato et al. | |
| 2006/0023109 A1 | 2/2006 | Mabuchi et al. | |
| 2006/0146159 A1 | 7/2006 | Farrier | |
| 2006/0157759 A1 | 7/2006 | Okita et al. | |
| 2006/0158541 A1 | 7/2006 | Ichikawa | |
| 2007/0013983 A1 | 1/2007 | Kitamura et al. | |
| 2007/0076109 A1 | 4/2007 | Krymski | |
| 2007/0076481 A1 | 4/2007 | Tennant | |
| 2007/0092244 A1 | 4/2007 | Pertsel et al. | |
| 2007/0102740 A1 | 5/2007 | Ellis-Monaghan et al. | |
| 2007/0131991 A1 | 6/2007 | Sugawa | |
| 2007/0208526 A1 | 9/2007 | Staudt et al. | |
| 2007/0216564 A1 | 9/2007 | Koseki | |
| 2007/0222881 A1 | 9/2007 | Mentzer | |
| 2008/0001065 A1 | 1/2008 | Ackland | |
| 2008/0007731 A1 | 1/2008 | Botchway et al. | |
| 2008/0042888 A1 | 2/2008 | Danesh | |
| 2008/0068478 A1 | 3/2008 | Watanabe | |
| 2008/0088014 A1 | 4/2008 | Adkisson et al. | |
| 2008/0191791 A1 | 8/2008 | Nomura et al. | |
| 2008/0226170 A1 | 9/2008 | Sonoda | |
| 2008/0226183 A1 | 9/2008 | Lei et al. | |
| 2008/0266434 A1 | 10/2008 | Sugawa et al. | |
| 2009/0002528 A1 | 1/2009 | Manabe et al. | |
| 2009/0033588 A1 | 2/2009 | Kajita et al. | |
| 2009/0040364 A1 | 2/2009 | Rubner | |
| 2009/0091645 A1 | 4/2009 | Trimeche et al. | |
| 2009/0128640 A1 | 5/2009 | Yumiki | |
| 2009/0140305 A1 | 6/2009 | Sugawa | |
| 2009/0219266 A1 | 9/2009 | Lim et al. | |
| 2009/0224139 A1 | 9/2009 | Buettgen et al. | |
| 2009/0237536 A1 | 9/2009 | Purcell et al. | |
| 2009/0244346 A1 | 10/2009 | Funaki | |
| 2009/0245637 A1 | 10/2009 | Barman et al. | |
| 2009/0256735 A1 | 10/2009 | Bogaerts | |
| 2009/0261235 A1 | 10/2009 | Lahav et al. | |
| 2009/0321615 A1 | 12/2009 | Sugiyama et al. | |
| 2010/0013969 A1 | 1/2010 | Ui | |
| 2010/0140732 A1 | 6/2010 | Eminoglu et al. | |
| 2010/0194956 A1 | 8/2010 | Yuan et al. | |
| 2010/0232227 A1 | 9/2010 | Lee | |

(56) References Cited

U.S. PATENT DOCUMENTS

| | | |
|---|---|---|
| 2010/0276572 A1 | 11/2010 | Iwabuchi et al. |
| 2011/0049589 A1 | 3/2011 | Chuang et al. |
| 2011/0122304 A1 | 5/2011 | Sedelnikov |
| 2011/0149116 A1 | 6/2011 | Kim |
| 2011/0155892 A1 | 6/2011 | Neter et al. |
| 2011/0254986 A1 | 10/2011 | Nishimura et al. |
| 2012/0016817 A1 | 1/2012 | Smith et al. |
| 2012/0039548 A1 | 2/2012 | Wang et al. |
| 2012/0068051 A1 | 3/2012 | Ahn et al. |
| 2012/0092677 A1 | 4/2012 | Suehira et al. |
| 2012/0105475 A1 | 5/2012 | Tseng |
| 2012/0105668 A1 | 5/2012 | Velarde et al. |
| 2012/0113119 A1 | 5/2012 | Massie |
| 2012/0127284 A1 | 5/2012 | Bar-Zeev et al. |
| 2012/0133807 A1 | 5/2012 | Wu et al. |
| 2012/0138775 A1 | 6/2012 | Cheon et al. |
| 2012/0153123 A1 | 6/2012 | Mao et al. |
| 2012/0188420 A1 | 7/2012 | Black et al. |
| 2012/0200499 A1 | 8/2012 | Osterhout et al. |
| 2012/0205520 A1 | 8/2012 | Hsieh et al. |
| 2012/0212465 A1 | 8/2012 | White et al. |
| 2012/0241591 A1 | 9/2012 | Wan et al. |
| 2012/0262616 A1 | 10/2012 | Sa et al. |
| 2012/0267511 A1 | 10/2012 | Kozlowski |
| 2012/0273654 A1 | 11/2012 | Hynecek et al. |
| 2012/0305751 A1 | 12/2012 | Kusuda |
| 2013/0020466 A1 | 1/2013 | Ayers et al. |
| 2013/0056809 A1 | 3/2013 | Mao et al. |
| 2013/0057742 A1 | 3/2013 | Nakamura et al. |
| 2013/0068929 A1 | 3/2013 | Solhusvik et al. |
| 2013/0069787 A1 | 3/2013 | Petrou |
| 2013/0082313 A1 | 4/2013 | Manabe |
| 2013/0113969 A1 | 5/2013 | Manabe et al. |
| 2013/0126710 A1 | 5/2013 | Kondo |
| 2013/0141619 A1 | 6/2013 | Lim et al. |
| 2013/0187027 A1 | 7/2013 | Qiao et al. |
| 2013/0207219 A1 | 8/2013 | Ahn |
| 2013/0214127 A1 | 8/2013 | Ohya et al. |
| 2013/0214371 A1 | 8/2013 | Asatsuma et al. |
| 2013/0218728 A1 | 8/2013 | Hashop et al. |
| 2013/0221194 A1 | 8/2013 | Manabe |
| 2013/0229543 A1 | 9/2013 | Hashimoto et al. |
| 2013/0229560 A1 | 9/2013 | Kondo |
| 2013/0234029 A1 | 9/2013 | Bikumandla |
| 2013/0293752 A1 | 11/2013 | Peng et al. |
| 2013/0299674 A1 | 11/2013 | Fowler et al. |
| 2014/0021574 A1 | 1/2014 | Egawa |
| 2014/0042299 A1 | 2/2014 | Wan et al. |
| 2014/0042582 A1 | 2/2014 | Kondo |
| 2014/0070974 A1 | 3/2014 | Park et al. |
| 2014/0078336 A1 | 3/2014 | Beck et al. |
| 2014/0085523 A1 | 3/2014 | Hynecek |
| 2014/0176770 A1 | 6/2014 | Kondo |
| 2014/0211052 A1 | 7/2014 | Choi |
| 2014/0232890 A1 | 8/2014 | Yoo et al. |
| 2014/0247382 A1 | 9/2014 | Moldovan et al. |
| 2014/0306276 A1 | 10/2014 | Yamaguchi |
| 2014/0368687 A1 | 12/2014 | Yu et al. |
| 2015/0070544 A1 | 3/2015 | Smith et al. |
| 2015/0077611 A1 | 3/2015 | Yamashita et al. |
| 2015/0083895 A1 | 3/2015 | Hashimoto et al. |
| 2015/0085134 A1 | 3/2015 | Novotny et al. |
| 2015/0090863 A1 | 4/2015 | Mansoorian et al. |
| 2015/0172574 A1 | 6/2015 | Honda et al. |
| 2015/0179696 A1 | 6/2015 | Kurokawa et al. |
| 2015/0189209 A1 | 7/2015 | Yang et al. |
| 2015/0201142 A1 | 7/2015 | Smith et al. |
| 2015/0208009 A1 | 7/2015 | Oh et al. |
| 2015/0229859 A1 | 8/2015 | Guidash et al. |
| 2015/0237274 A1 | 8/2015 | Yang et al. |
| 2015/0279884 A1 | 10/2015 | Kusumoto |
| 2015/0281613 A1 | 10/2015 | Vogelsang et al. |
| 2015/0287766 A1 | 10/2015 | Kim et al. |
| 2015/0309311 A1 | 10/2015 | Cho |
| 2015/0309316 A1 | 10/2015 | Osterhout et al. |
| 2015/0312461 A1 | 10/2015 | Kim et al. |
| 2015/0312502 A1 | 10/2015 | Borremans |
| 2015/0312557 A1 | 10/2015 | Kim |
| 2015/0350582 A1 | 12/2015 | Korobov et al. |
| 2015/0358569 A1 | 12/2015 | Egawa |
| 2015/0358571 A1 | 12/2015 | Dominguez Castro et al. |
| 2015/0358593 A1 | 12/2015 | Sato |
| 2015/0381907 A1 | 12/2015 | Boettiger et al. |
| 2015/0381911 A1 | 12/2015 | Shen et al. |
| 2016/0011422 A1 | 1/2016 | Thurber et al. |
| 2016/0018645 A1 | 1/2016 | Haddick et al. |
| 2016/0021302 A1 | 1/2016 | Cho et al. |
| 2016/0028974 A1 | 1/2016 | Guidash et al. |
| 2016/0028980 A1 | 1/2016 | Kameyama et al. |
| 2016/0037111 A1 | 2/2016 | Dai et al. |
| 2016/0078614 A1 | 3/2016 | Ryu et al. |
| 2016/0088253 A1 | 3/2016 | Tezuka |
| 2016/0100113 A1 | 4/2016 | Oh et al. |
| 2016/0100115 A1 | 4/2016 | Kusano |
| 2016/0111457 A1 | 4/2016 | Sekine |
| 2016/0112626 A1 | 4/2016 | Shimada |
| 2016/0118992 A1 | 4/2016 | Milkov |
| 2016/0165160 A1 | 6/2016 | Hseih et al. |
| 2016/0197117 A1 | 7/2016 | Nakata et al. |
| 2016/0204150 A1 | 7/2016 | Oh et al. |
| 2016/0210785 A1 | 7/2016 | Balachandreswaran et al. |
| 2016/0240570 A1 | 8/2016 | Barna et al. |
| 2016/0249004 A1 | 8/2016 | Saeki et al. |
| 2016/0255293 A1 | 9/2016 | Gesset |
| 2016/0277010 A1 | 9/2016 | Park et al. |
| 2016/0307945 A1 | 10/2016 | Madurawe |
| 2016/0307949 A1 | 10/2016 | Madurawe |
| 2016/0309140 A1 | 10/2016 | Wang et al. |
| 2016/0337605 A1 | 11/2016 | Ito |
| 2016/0353045 A1 | 12/2016 | Kawahito et al. |
| 2016/0360127 A1 | 12/2016 | Dierickx et al. |
| 2017/0013215 A1 | 1/2017 | Mccarten |
| 2017/0039906 A1 | 2/2017 | Jepsen |
| 2017/0041571 A1 | 2/2017 | Tyrrell et al. |
| 2017/0053962 A1 | 2/2017 | Oh et al. |
| 2017/0059399 A1 | 3/2017 | Suh et al. |
| 2017/0062501 A1 | 3/2017 | Velichko et al. |
| 2017/0069363 A1 | 3/2017 | Baker |
| 2017/0070691 A1 | 3/2017 | Nishikido |
| 2017/0099422 A1 | 4/2017 | Goma et al. |
| 2017/0099446 A1 | 4/2017 | Cremers et al. |
| 2017/0104021 A1 | 4/2017 | Park et al. |
| 2017/0104946 A1 | 4/2017 | Hong |
| 2017/0111600 A1 | 4/2017 | Wang et al. |
| 2017/0141147 A1* | 5/2017 | Raynor ............. H01L 27/14643 |
| 2017/0154909 A1 | 6/2017 | Ishizu |
| 2017/0170223 A1 | 6/2017 | Hynecek et al. |
| 2017/0195602 A1 | 7/2017 | Iwabuchi et al. |
| 2017/0201693 A1 | 7/2017 | Sugizaki et al. |
| 2017/0207268 A1 | 7/2017 | Kurokawa |
| 2017/0228345 A1 | 8/2017 | Gupta et al. |
| 2017/0251151 A1 | 8/2017 | Hicks |
| 2017/0270664 A1 | 9/2017 | Hoogi et al. |
| 2017/0272667 A1 | 9/2017 | Hynecek |
| 2017/0272768 A1 | 9/2017 | Tall et al. |
| 2017/0280031 A1 | 9/2017 | Price et al. |
| 2017/0293799 A1 | 10/2017 | Skogo et al. |
| 2017/0310910 A1 | 10/2017 | Smith et al. |
| 2017/0318250 A1 | 11/2017 | Sakakibara et al. |
| 2017/0324917 A1 | 11/2017 | Mlinar et al. |
| 2017/0338262 A1 | 11/2017 | Hirata |
| 2017/0339327 A1 | 11/2017 | Koshkin et al. |
| 2017/0346579 A1 | 11/2017 | Barghi |
| 2017/0350755 A1 | 12/2017 | Geurts |
| 2017/0359497 A1 | 12/2017 | Mandelli et al. |
| 2017/0359521 A1 | 12/2017 | Kim |
| 2017/0366766 A1 | 12/2017 | Geurts et al. |
| 2018/0019269 A1 | 1/2018 | Klipstein |
| 2018/0077368 A1 | 3/2018 | Suzuki |
| 2018/0115725 A1 | 4/2018 | Zhang et al. |
| 2018/0136471 A1 | 5/2018 | Miller et al. |
| 2018/0143701 A1 | 5/2018 | Suh et al. |
| 2018/0152650 A1 | 5/2018 | Sakakibara et al. |
| 2018/0167575 A1 | 6/2018 | Watanabe et al. |

(56) References Cited

U.S. PATENT DOCUMENTS

| | | | |
|---|---|---|---|
| 2018/0175083 A1 | 6/2018 | Takahashi | |
| 2018/0176545 A1 | 6/2018 | Aflaki Beni | |
| 2018/0204867 A1 | 7/2018 | Kim et al. | |
| 2018/0220093 A1 | 8/2018 | Murao et al. | |
| 2018/0224658 A1 | 8/2018 | Teller | |
| 2018/0227516 A1 | 8/2018 | Mo et al. | |
| 2018/0241953 A1 | 8/2018 | Johnson | |
| 2018/0270436 A1 | 9/2018 | Ivarsson et al. | |
| 2018/0276841 A1 | 9/2018 | Krishnaswamy et al. | |
| 2018/0376046 A1 | 12/2018 | Liu | |
| 2018/0376090 A1 | 12/2018 | Liu | |
| 2019/0035154 A1 | 1/2019 | Liu | |
| 2019/0046044 A1 | 2/2019 | Tzvieli et al. | |
| 2019/0052788 A1 | 2/2019 | Liu | |
| 2019/0052821 A1* | 2/2019 | Berner | H04N 5/363 |
| 2019/0056264 A1 | 2/2019 | Liu | |
| 2019/0057995 A1 | 2/2019 | Liu | |
| 2019/0058058 A1 | 2/2019 | Liu | |
| 2019/0098232 A1* | 3/2019 | Mori | H04N 5/37455 |
| 2019/0104263 A1 | 4/2019 | Ochiai et al. | |
| 2019/0104265 A1 | 4/2019 | Totsuka et al. | |
| 2019/0110039 A1 | 4/2019 | Linde et al. | |
| 2019/0115931 A1 | 4/2019 | Hurwitz et al. | |
| 2019/0123088 A1 | 4/2019 | Kwon | |
| 2019/0124285 A1 | 4/2019 | Otaka | |
| 2019/0141270 A1* | 5/2019 | Otaka | H04N 5/23245 |
| 2019/0149751 A1 | 5/2019 | Wise | |
| 2019/0157330 A1 | 5/2019 | Sato et al. | |
| 2019/0172227 A1 | 6/2019 | Kasahara | |
| 2019/0172868 A1 | 6/2019 | Chen et al. | |
| 2019/0191116 A1 | 6/2019 | Madurawe | |
| 2019/0246036 A1 | 8/2019 | Wu et al. | |
| 2019/0253650 A1 | 8/2019 | Kim | |
| 2019/0327439 A1 | 10/2019 | Chen et al. | |
| 2019/0331914 A1 | 10/2019 | Lee et al. | |
| 2019/0335151 A1 | 10/2019 | Rivard et al. | |
| 2019/0348460 A1 | 11/2019 | Chen et al. | |
| 2019/0355782 A1 | 11/2019 | Do et al. | |
| 2019/0363118 A1 | 11/2019 | Berkovich et al. | |
| 2019/0371845 A1 | 12/2019 | Chen et al. | |
| 2019/0376845 A1 | 12/2019 | Liu et al. | |
| 2019/0379388 A1* | 12/2019 | Gao | H03M 1/58 |
| 2019/0379827 A1 | 12/2019 | Berkovich et al. | |
| 2019/0379846 A1 | 12/2019 | Chen et al. | |
| 2020/0007800 A1 | 1/2020 | Berkovich et al. | |
| 2020/0053299 A1 | 2/2020 | Zhang et al. | |
| 2020/0059589 A1 | 2/2020 | Liu et al. | |
| 2020/0068189 A1 | 2/2020 | Chen et al. | |
| 2020/0186731 A1 | 6/2020 | Chen et al. | |
| 2020/0195875 A1 | 6/2020 | Berkovich et al. | |
| 2020/0217714 A1 | 7/2020 | Liu | |
| 2020/0228745 A1 | 7/2020 | Otaka | |
| 2020/0374475 A1 | 11/2020 | Fukuoka et al. | |
| 2021/0026796 A1 | 1/2021 | Graif et al. | |
| 2021/0099659 A1* | 4/2021 | Miyauchi | H04N 5/3559 |
| 2021/0185264 A1 | 6/2021 | Wong et al. | |
| 2021/0227159 A1 | 7/2021 | Sambonsugi | |
| 2021/0368124 A1 | 11/2021 | Berkovich et al. | |
| 2023/0080288 A1 | 3/2023 | Berkovich et al. | |
| 2023/0092325 A1 | 3/2023 | Tsai et al. | |
| 2023/0239582 A1 | 7/2023 | Berkovich et al. | |

FOREIGN PATENT DOCUMENTS

| | | |
|---|---|---|
| CN | 1812506 A | 8/2006 |
| CN | 101753866 A | 6/2010 |
| CN | 103002228 A | 3/2013 |
| CN | 103207716 A | 7/2013 |
| CN | 104125418 A | 10/2014 |
| CN | 104204904 A | 12/2014 |
| CN | 104469195 A | 3/2015 |
| CN | 104704812 A | 6/2015 |
| CN | 104733485 A | 6/2015 |
| CN | 104754255 A | 7/2015 |
| CN | 204633945 U | 9/2015 |
| CN | 105144699 A | 12/2015 |
| CN | 105529342 A | 4/2016 |
| CN | 105706439 A | 6/2016 |
| CN | 205666884 U | 10/2016 |
| CN | 106255978 A | 12/2016 |
| CN | 106791504 A | 5/2017 |
| CN | 107852473 A | 3/2018 |
| CN | 109298528 A | 2/2019 |
| DE | 202016105510 | 10/2016 |
| DE | 202016105510 U1 | 10/2016 |
| EP | 0675345 A2 | 10/1995 |
| EP | 0675345 A2 | 10/1995 |
| EP | 1681856 A2 | 7/2006 |
| EP | 1681856 A2 | 7/2006 |
| EP | 1732134 A1 | 12/2006 |
| EP | 1732134 A1 | 12/2006 |
| EP | 1746820 A1 | 1/2007 |
| EP | 1746820 A1 | 1/2007 |
| EP | 1788802 A1 | 5/2007 |
| EP | 2037505 A1 | 3/2009 |
| EP | 2063630 A1 | 5/2009 |
| EP | 2063630 A1 | 5/2009 |
| EP | 2538664 A2 | 12/2012 |
| EP | 2538664 A2 | 12/2012 |
| EP | 2804074 A2 | 11/2014 |
| EP | 2833619 A1 | 2/2015 |
| EP | 2833619 A1 | 2/2015 |
| EP | 3032822 A1 | 6/2016 |
| EP | 3032822 A1 | 6/2016 |
| EP | 3229457 A1 | 10/2017 |
| EP | 3258683 A1 | 12/2017 |
| EP | 3258683 A1 | 12/2017 |
| EP | 3425352 A1 | 1/2019 |
| EP | 3425352 A1 | 1/2019 |
| EP | 3439039 A1 | 2/2019 |
| EP | 3744085 A2 | 12/2020 |
| EP | 3744085 A2 | 12/2020 |
| JP | H08195906 A | 7/1996 |
| JP | 2001008101 A | 1/2001 |
| JP | 2002199292 A | 7/2002 |
| JP | 2003319262 A | 11/2003 |
| JP | 2005328493 A | 11/2005 |
| JP | 2006197382 A | 7/2006 |
| JP | 2006203736 A | 8/2006 |
| JP | 2007074447 A | 3/2007 |
| JP | 2011216966 A | 10/2011 |
| JP | 2012054495 A | 3/2012 |
| JP | 2012054876 A | 3/2012 |
| JP | 2012095349 A | 5/2012 |
| JP | 2013009087 A | 1/2013 |
| JP | 2013055581 A | 3/2013 |
| JP | 2013172203 A | 9/2013 |
| JP | 2013225774 A | 10/2013 |
| JP | 2014107596 A | 6/2014 |
| JP | 2014165733 A | 9/2014 |
| JP | 2014236183 A | 12/2014 |
| JP | 2015065524 A | 4/2015 |
| JP | 2015126043 A | 7/2015 |
| JP | 2015530855 A | 10/2015 |
| JP | 2015211259 A | 11/2015 |
| JP | 2016092661 A | 5/2016 |
| JP | 2016513942 A | 5/2016 |
| JP | 2017509251 A | 3/2017 |
| KR | 100574959 B1 | 4/2006 |
| KR | 100574959 B1 | 4/2006 |
| KR | 20080019652 A | 3/2008 |
| KR | 20090023549 A | 3/2009 |
| KR | 20110050351 A | 5/2011 |
| KR | 20110050351 A | 5/2011 |
| KR | 20110134941 A | 12/2011 |
| KR | 20120058337 A | 6/2012 |
| KR | 20120117953 A | 10/2012 |
| KR | 20150095841 A | 8/2015 |
| KR | 20150095841 A | 8/2015 |
| KR | 20160008267 A | 1/2016 |
| KR | 20160008287 A | 1/2016 |
| KR | 20160008287 A | 1/2016 |
| TW | 201448184 A | 12/2014 |
| TW | 201719874 A | 6/2017 |

(56) References Cited

FOREIGN PATENT DOCUMENTS

| | | |
|---|---|---|
| TW | 201728161 A | 8/2017 |
| TW | 624694 B | 5/2018 |
| WO | 2006124592 A2 | 11/2006 |
| WO | 2006129762 A1 | 12/2006 |
| WO | 2010117462 A1 | 10/2010 |
| WO | 2013099723 A1 | 7/2013 |
| WO | WO-2014055391 A2 | 4/2014 |
| WO | 2014144391 A1 | 9/2014 |
| WO | 2015135836 A1 | 9/2015 |
| WO | 2015182390 A1 | 12/2015 |
| WO | 2016014860 A1 | 1/2016 |
| WO | WO-2016095057 A1 | 6/2016 |
| WO | 2016194653 A1 | 12/2016 |
| WO | WO-2017003477 A1 | 1/2017 |
| WO | WO-2017013806 A1 | 1/2017 |
| WO | WO-2017047010 A1 | 3/2017 |
| WO | 2017058488 A1 | 4/2017 |
| WO | 2017069706 A1 | 4/2017 |
| WO | WO-2017058488 A1 | 4/2017 |
| WO | WO-2017069706 A1 | 4/2017 |
| WO | 2017169882 A1 | 10/2017 |
| WO | WO-2017169446 A1 | 10/2017 |
| WO | WO-2017169882 A1 | 10/2017 |
| WO | WO-2019018084 A1 | 1/2019 |
| WO | WO-2019111528 A1 | 6/2019 |
| WO | WO-2019145578 A1 | 8/2019 |
| WO | 2019168929 | 9/2019 |
| WO | WO-2019168929 A1 | 9/2019 |

OTHER PUBLICATIONS

Non-Final Office Action dated Mar. 2, 2022 for U.S. Appl. No. 17/127,670, filed Dec. 18, 2020, 18 pages.
Notice of Allowance dated Mar. 2, 2022 for U.S. Appl. No. 16/453,538, filed Jun. 26, 2019, 8 pages.
Notice of Allowance dated Mar. 7, 2022 for U.S. Appl. No. 16/421,441, filed May 23, 2019, 18 pages.
Notice of Allowance dated Mar. 11, 2022 for U.S. Appl. No. 16/716,050, filed Dec. 16, 2019, 13 pages.
Notification of the First Office Action dated Oct. 28, 2021 for Chinese Application No. 2019800218483, filed Jan. 24, 2019, 17 pages.
Taiwan Application No. 107124385, Office Action dated Sep. 30, 2021, 17 pages (8 pages of Original Document and 9 pages of English Translation).
Corrected Notice of Allowance dated Mar. 29, 2022 for U.S. Appl. No. 17/150,925, filed Jan. 15, 2021, 2 Pages.
International Search Report and Written Opinion for International Application No. PCT/US2021/065174 dated Mar. 28, 2022, 10 pages.
Non-Final Office Action dated Apr. 13, 2022 for U.S. Appl. No. 16/820,594, filed Mar. 16, 2020, 7 pages.
Non-Final Office Action dated Mar. 28, 2022 for U.S. Appl. No. 17/072,840, filed Oct. 16, 2020, 8 Pages.
Office Action dated Mar. 15, 2022 for Japanese Patent Application No. 2020505830, filed on Aug. 9, 2018, 12 pages.
Office Action dated Mar. 17, 2022 for Taiwan Application No. 20180124384, 26 pages.
Office Action dated Mar. 29, 2022 for Japanese Patent Application No. 2020520431, filed on Jun. 25, 2018, 10 pages.
Notice of Allowance dated Jul. 5, 2022 for U.S. Appl. No. 16/899,908, filed Jun. 12, 2020, 10 pages.
Notice of Allowance dated Apr. 19, 2022 for U.S. Appl. No. 16/899,908, filed Jun. 12, 2020, 10 pages.
Notice of Allowance dated Apr. 27, 2022 for U.S. Appl. No. 16/896,130, filed Jun. 8, 2020, 08 pages.
Notice of Allowance dated Apr. 28, 2022 for U.S. Appl. No. 16/435,451, filed Jun. 7, 2019, 09 pages.
Notice of Allowance dated Jun. 8, 2022 for U.S. Appl. No. 17/150,925, filed Jan. 15, 2021, 10 pages.
Office Action for European Application No. 18179851.3, dated May 19, 2022, 7 pages.
Office Action dated Jul. 5, 2022 for Korean Application No. 10-2020-7002533, filed Jun. 25, 2018, 13 pages.
Office Action dated May 18, 2022 for Taiwan Application No. 108122878, 24 pages.
Office Action dated Jul. 12, 2022 for Japanese Application No. 2019-571699, filed Jun. 25, 2018, 5 pages.
Office Action dated Jul. 19, 2022 for Japanese Application No. 2019571598, filed Jun. 26, 2018, 10 pages.
Notice of Allowance dated Aug. 10, 2022 for U.S. Appl. No. 16/896,130, filed Jun. 8, 2020, 8 pages.
Notice of Allowance dated Aug. 22, 2022 for U.S. Appl. No. 16/435,451, filed Jun. 7, 2019, 08 pages.
Notice of Allowance dated Sep. 22, 2022 for U.S. Appl. No. 17/150,925, filed Jan. 15, 2021, 9 pages.
Notice of Allowance dated Aug. 23, 2022 for U.S. Appl. No. 16/896,130, filed Jun. 8, 2020, 2 pages.
Office Action dated Sep. 26, 2022 for Korean Patent Application No. 10-2020-7002496, filed on Jun. 26, 2018, 17 pages.
Office Action dated Aug. 30, 2022 for Japanese Patent Application No. 2020505830, filed on Aug. 9, 2018, 5 pages.
U.S. Appl. No. 15/668,241 , "Advisory Action", dated Oct. 23, 2019, 5 pages.
U.S. Appl. No. 15/668,241 , "Final Office Action", dated Jun. 17, 2019, 19 pages.
U.S. Appl. No. 15/668,241 , "Non-Final Office Action", dated Dec. 21, 2018, 3 pages.
U.S. Appl. No. 15/668,241 , "Notice of Allowance", dated Jun. 29, 2020, 8 pages.
U.S. Appl. No. 15/668,241 , "Notice of Allowance", dated Mar. 5, 2020, 8 pages.
U.S. Appl. No. 15/668,241 , "Supplemental Notice of Allowability", dated Apr. 29, 2020, 5 pages.
U.S. Appl. No. 15/719,345 , "Final Office Action", dated Apr. 29, 2020, 14 pages.
U.S. Appl. No. 15/719,345 , "Non-Final Office Action", dated Nov. 25, 2019, 14 pages.
U.S. Appl. No. 15/719,345 , "Notice of Allowance", dated Aug. 12, 2020, 10 pages.
U.S. Appl. No. 15/719,345 , "Notice of Allowance", dated Sep. 3, 2020, 12 pages.
U.S. Appl. No. 15/801,216 , "Advisory Action", dated Apr. 7, 2020, 3 pages.
U.S. Appl. No. 15/801,216 , "Final Office Action", dated Dec. 26, 2019, 5 pages.
U.S. Appl. No. 15/801,216, "Non-Final Office Action", dated Jun. 27, 2019, 13 pages.
U.S. Appl. No. 15/801,216 , "Notice of Allowance", dated Jun. 23, 2020, 5 pages.
U.S. Appl. No. 15/847,517 , "Non-Final Office Action", dated Nov. 23, 2018, 21 pages.
U.S. Appl. No. 15/847,517 , "Notice of Allowance", dated May 1, 2019, 11 pages.
U.S. Appl. No. 15/861,588 , "Non-Final Office Action", dated Jul. 10, 2019, 11 pages.
U.S. Appl. No. 15/861,588 , "Notice of Allowance", dated Nov. 26, 2019, 9 pages.
U.S. Appl. No. 15/876,061 , "Corrected Notice of Allowability", dated Apr. 28, 2020, 2 pages.
U.S. Appl. No. 15/876,061 , "Non-Final Office Action", dated Sep. 18, 2019, 23 pages.
U.S. Appl. No. 15/876,061 , "Notice of Allowability", dated May 6, 2020, 2 pages.
U.S. Appl. No. 15/876,061 , "Notice of Allowance", dated Feb. 4, 2020, 13 pages.
U.S. Appl. No. 15/927,896 , "Non-Final Office Action", dated May 1, 2019, 10 pages.
U.S. Appl. No. 15/983,379 , "Notice of Allowance", dated Oct. 18, 2019, 9 pages.
U.S. Appl. No. 15/983,391 , "Non-Final Office Action", dated Aug. 29, 2019, 12 pages.

(56) References Cited

OTHER PUBLICATIONS

U.S. Appl. No. 15/983,391, "Notice of Allowance", dated Apr. 8, 2020, 8 pages.
U.S. Appl. No. 16/177,971, "Final Office Action", dated Feb. 27, 2020, 9 pages.
U.S. Appl. No. 16/177,971, "Non-Final Office Action", dated Sep. 25, 2019, 9 pages.
U.S. Appl. No. 16/177,971, "Notice of Allowance", dated Apr. 24, 2020, 6 pages.
U.S. Appl. No. 16/210,748, "Final Office Action", dated Jul. 7, 2020, 11 pages.
U.S. Appl. No. 16/210,748, "Non-Final Office Action", dated Jan. 31, 2020, 11 pages.
U.S. Appl. No. 16/249,420, "Non-Final Office Action", dated Jul. 22, 2020, 9 pages.
U.S. Appl. No. 16/249,420, "Notice of Allowance", dated Nov. 18, 2020, 8 pages.
U.S. Appl. No. 16/286,355, "Non-Final Office Action", dated Oct. 1, 2019, 6 pages.
U.S. Appl. No. 16/286,355, "Notice of Allowance", dated Feb. 12, 2020, 7 pages.
U.S. Appl. No. 16/286,355, "Notice of Allowance", dated Jun. 4, 2020, 7 pages.
U.S. Appl. No. 16/369,763, "Non-Final Office Action", dated Jul. 22, 2020, 15 pages.
U.S. Appl. No. 16/382,015, "Notice of Allowance", dated Jun. 11, 2020, 11 pages.
U.S. Appl. No. 16/384,720, "Non-Final Office Action", dated May 1, 2020, 6 pages.
U.S. Appl. No. 16/384,720, "Notice of Allowance", dated Aug. 26, 2020, 8 pages.
U.S. Appl. No. 16/431,693, "Non-Final Office Action", dated Jan. 30, 2020, 6 pages.
U.S. Appl. No. 16/431,693, "Notice of Allowance", dated Jun. 24, 2020, 7 pages.
U.S. Appl. No. 16/435,449, "Notice of Allowance", dated Sep. 16, 2020, 7 pages.
U.S. Appl. No. 16/435,449, "Notice of Allowance", dated Jul. 27, 2020, 8 pages.
U.S. Appl. No. 16/435,451, "Final Office Action", dated Jul. 12, 2021, 13 pages.
U.S. Appl. No. 16/435,451, "Non-Final Office Action", dated Feb. 1, 2021, 14 pages.
U.S. Appl. No. 16/436,049, "Non-Final Office Action", dated Jun. 30, 2020, 11 pages.
U.S. Appl. No. 16/436,049, "Non-Final Office Action", dated Mar. 4, 2020, 9 pages.
U.S. Appl. No. 16/436,049, "Notice of Allowance", dated Oct. 21, 2020, 8 pages.
U.S. Appl. No. 16/436,137, "Non-Final Office Action", dated Dec. 4, 2020, 12 pages.
U.S. Appl. No. 16/436,137, "Notice of Allowance", dated Apr. 7, 2021, 9 pages.
U.S. Appl. No. 16/454,787, "Notice of Allowance", dated Apr. 22, 2020, 10 pages.
U.S. Appl. No. 16/454,787, "Notice of Allowance", dated Jul. 9, 2020, 9 pages.
U.S. Appl. No. 16/454,787, "Notice of Allowance", dated Sep. 9, 2020, 9 pages.
U.S. Appl. No. 16/566,583, "Corrected Notice of Allowability", dated Dec. 11, 2020, 2 pages.
U.S. Appl. No. 16/566,583, "Corrected Notice of Allowability", dated Feb. 3, 2021, 2 pages.
U.S. Appl. No. 16/566,583, "Final Office Action", dated Apr. 15, 2020, 24 pages.
U.S. Appl. No. 16/566,583, "Non-Final Office Action", dated Oct. 1, 2019, 10 pages.
U.S. Appl. No. 16/566,583, "Non-Final Office Action", dated Jul. 27, 2020, 11 pages.
U.S. Appl. No. 16/566,583, "Notice of Allowance", dated Nov. 3, 2020, 11 pages.
U.S. Appl. No. 16/707,988, "Corrected Notice of Allowability", dated Jul. 26, 2021, 2 pages.
U.S. Appl. No. 16/707,988, "Non-Final Office Action", dated Sep. 22, 2020, 15 pages.
U.S. Appl. No. 16/707,988, "Notice of Allowance", dated May 5, 2021, 13 pages.
U.S. Appl. No. 16/820,594, "Non-Final Office Action", dated Jul. 2, 2021, 8 pages.
U.S. Appl. No. 16/896,130, "Non-Final Office Action", dated Mar. 15, 2021, 16 pages.
U.S. Appl. No. 16/896,130, "Notice of Allowance", dated Jul. 13, 2021, 8 pages.
U.S. Appl. No. 16/899,908, "Notice of Allowance", dated Sep. 17, 2021, 11 pages.
U.S. Appl. No. 17/072,840, "Non-Final Office Action", dated Jun. 8, 2021, 7 pages.
U.S. Appl. No. 17/150,925, "Notice of Allowance", dated Jul. 8, 2021, 10 pages.
Cho et al., "A Low Power Dual CDS for a Column-Parallel CMOS Image Sensor", Journal of Semiconductor Technology and Science, vol. 12, No. 4, Dec. 30, 2012, pp. 388-396.
EP18179838.0, "Extended European Search Report", dated May 24, 2019, 17 pages.
EP18179838.0, "Partial European Search Report", dated Dec. 5, 2018, 14 pages.
EP18179846.3, "Extended European Search Report", dated Dec. 7, 2018, 10 pages.
EP18179851.3, "Extended European Search Report", dated Dec. 7, 2018, 8 pages.
EP18188684.7, "Extended European Search Report", dated Jan. 16, 2019, 10 pages.
EP18188684.7, "Office Action", dated Nov. 26, 2019, 9 pages.
EP18188962.7, "Extended European Search Report", dated Oct. 23, 2018, 8 pages.
EP18188962.7, "Office Action", dated Aug. 28, 2019, 6 pages.
EP18188968.4, "Extended European Search Report", dated Oct. 23, 2018, 8 pages.
EP18188968.4, "Office Action", dated Aug. 14, 2019, 5 pages.
EP18189100.3, "Extended European Search Report", dated Oct. 9, 2018, 8 pages.
EP19737299.8, "Office Action", dated Jul. 7, 2021, 5 pages.
Kavusi et al., "Quantitative Study of High-Dynamic-Range Image Sensor Architectures", Proceedings of Society of Photo-Optical Instrumentation Engineers—The International Society for Optical Engineering, vol. 5301, Jun. 7, 2004, pp. 264-275.
PCT/US2018/039350, "International Preliminary Report on Patentability", dated Jan. 9, 2020, 10 pages.
PCT/US2018/039350, "International Search Report and Written Opinion", dated Nov. 15, 2018, 13 pages.
PCT/US2018/039352, "International Search Report and Written Opinion", dated Oct. 26, 2018, 10 pages.
PCT/US2018/039431, "International Search Report and Written Opinion", dated Nov. 7, 2018, 14 pages.
PCT/US2018/045661, "International Search Report and Written Opinion", dated Nov. 30, 2018, 11 Pages.
PCT/US2018/045666, "International Preliminary Report on Patentability", dated Feb. 27, 2020, 11 pages.
PCT/US2018/045666, "International Search Report and Written Opinion", dated Dec. 3, 2018, 13 pages.
PCT/US2018/045673, "International Search Report and Written Opinion", dated Dec. 4, 2018, 13 pages.
PCT/US2018/046131, "International Search Report and Written Opinion", dated Dec. 3, 2018, 10 pages.
PCT/US2018/064181, "International Preliminary Report on Patentability", dated Jun. 18, 2020, 9 pages.
PCT/US2018/064181, "International Search Report and Written Opinion", dated Mar. 29, 2019, 12 pages.
PCT/US2019/014044, "International Search Report and Written Opinion", dated May 8, 2019, 11 pages.
PCT/US2019/019756, "International Search Report and Written Opinion", dated Jun. 13, 2019, 11 pages.

(56) References Cited

OTHER PUBLICATIONS

PCT/US2019/025170, "International Search Report and Written Opinion", dated Jul. 9, 2019, 11 pages.
PCT/US2019/027727, "International Search Report and Written Opinion", dated Jun. 27, 2019, 11 pages.
PCT/US2019/027729, "International Search Report and Written Opinion", dated Jun. 27, 2019, 10 pages.
PCT/US2019/031521, "International Search Report and Written Opinion", dated Jul. 11, 2019, 11 pages.
PCT/US2019/035724, "International Search Report and Written Opinion", dated Sep. 10, 2019, 12 pages.
PCT/US2019/036484, "International Search Report and Written Opinion", dated Sep. 19, 2019, 10 pages.
PCT/US2019/036492, "International Search Report and Written Opinion", dated Sep. 25, 2019, 9 pages.
PCT/US2019/036536, "International Search Report and Written Opinion", dated Sep. 26, 2019, 14 pages.
PCT/US2019/036575, "International Search Report and Written Opinion", dated Sep. 30, 2019, 16 pages.
PCT/US2019/039410, "International Search Report and Written Opinion", dated Sep. 30, 2019, 11 pages.
PCT/US2019/039758, "International Search Report and Written Opinion", dated Oct. 11, 2019, 13 pages.
PCT/US2019/047156, "International Search Report and Written Opinion", dated Oct. 23, 2019, 9 pages.
PCT/US2019/048241, "International Search Report and Written Opinion", dated Jan. 28, 2020, 16 pages.
PCT/US2019/049756, "International Search Report and Written Opinion", dated Dec. 16, 2019, 8 pages.
PCT/US2019/059754, "International Search Report and Written Opinion", dated Mar. 24, 2020, 15 pages.
PCT/US2019/065430, "International Search Report and Written Opinion", dated Mar. 6, 2020, 13 pages.
Snoeij et al., "A Low Power Column-Parallel 12-Bit ADC for CMOS Imagers", Institute of Electrical and Electronics Engineers Workshop on Charge-Coupled Devices and Advanced Image Sensors, Jun. 1, 2005, pp. 169-172.
Tanner et al., "Low-Power Digital Image Sensor for Still Picture Image Acquisition", Visual Communications and Image Processing, vol. 4306, May 15, 2001, 8 pages.
Xu et al., "A New Digital-Pixel Architecture for CMOS Image Sensor with Pixel-Level ADC and Pulse Width Modulation using a 0.18 Mu M CMOS Technology", Institute of Electrical and Electronics Engineers Conference on Electron Devices and Solid-State Circuits, Dec. 16-18, 2003, pp. 265-268.
International Preliminary Report on Patentability for International Application No. PCT/US2020/044807, dated Feb. 17, 2022, 10 pages.
Notice of Allowance dated Feb. 16, 2022 for U.S. Appl. No. 17/150,925, filed Jan. 15, 2021, 9 pages.
International Search Report and Written Opinion for International Application No. PCT/US2021/054327, dated Feb. 14, 2022, 8 pages.
Advisory Action dated Apr. 7, 2020 for U.S. Appl. No. 15/801,216, filed Nov. 1, 2019, 3 Pages.
Advisory Action dated Oct. 8, 2020 for U.S. Appl. No. 16/210,748, filed Dec. 5, 2018, 4 Pages.
Advisory Action dated Oct. 23, 2019 for U.S. Appl. No. 15/668,241, filed Aug. 3, 2017, 5 Pages.
Amir M.F., et al., "3-D Stacked Image Sensor With Deep Neural Network Computation," IEEE Sensors Journal, IEEE Service Center, New York, NY, US, May 15, 2018, vol. 18 (10), pp. 4187-4199, XP011681876.
Cho K., et al., "A Low Power Dual CDS for a Column-Parallel CMOS Image Sensor," Journal of Semiconductor Technology and Science, Dec. 30, 2012, vol. 12 (4), pp. 388-396.
Chuxi L., et al., "A Memristor-Based Processing-in-Memory Architechture for Deep Convolutional Neural Networks Approximate Computation," Journal of Computer Research and Development, Jun. 30, 2017, vol. 54 (6), pp. 1367-1380.

Communication Pursuant Article 94(3) dated Dec. 23, 2021 for European Application No. 19744961.4, filed Jun. 28, 2019, 8 pages.
Communication Pursuant Article 94(3) dated Jan. 5, 2022 for European Application No. 19740456.9, filed Jun. 27, 2019, 12 pages.
Corrected Notice of Allowability dated Feb. 3, 2021 for U.S. Appl. No. 16/566,583, filed Sep. 10, 2019, 2 Pages.
Corrected Notice of Allowability dated Apr. 9, 2021 for U.S. Appl. No. 16/255,528, filed Jan. 23, 2019, 5 Pages.
Corrected Notice of Allowability dated Dec. 11, 2020 for U.S. Appl. No. 16/566,583, filed Sep. 10, 2019, 2 Pages.
Corrected Notice of Allowability dated Jul. 26, 2021 for U.S. Appl. No. 16/707,988, filed Dec. 9, 2019, 2 Pages.
Corrected Notice of Allowability dated Apr. 28, 2020 for U.S. Appl. No. 15/876,061, filed Jan. 19, 2018, 2 Pages.
Extended European Search Report for European Application No. 18179838.0, dated May 24, 2019, 17 Pages.
Extended European Search Report for European Application No. 18179846.3, dated Dec. 7, 2018, 10 Pages.
Extended European Search Report for European Application No. 18179851.3, dated Dec. 7, 2018, 8 Pages.
Extended European Search Report for European Application No. 18188684.7, dated Jan. 16, 2019, 10 Pages.
Extended European Search Report for European Application No. 18188962.7, dated Oct. 23, 2018, 8 Pages.
Extended European Search Report for European Application No. 18188968.4, dated Oct. 23, 2018, 8 Pages.
Extended European Search Report for European Application No. 18189100.3, dated Oct. 9, 2018, 8 Pages.
Extended European Search Report for European Application No. 19743908.6, dated Sep. 30, 2020, 9 Pages.
Final Office Action dated Dec. 3, 2021 for U.S. Appl. No. 17/072,840, filed Oct. 16, 2020, 23 pages.
Final Office Action dated Jul. 7, 2020 for U.S. Appl. No. 16/210,748, filed Dec. 5, 2018, 11 Pages.
Final Office Action dated Jul. 12, 2021 for U.S. Appl. No. 16/435,451, filed Jun. 7, 2019, 13 Pages.
Final Office Action dated Apr. 15, 2020 for U.S. Appl. No. 16/566,583, filed Sep. 10, 2019, 24 Pages.
Final Office Action dated Jun. 17, 2019 for U.S. Appl. No. 15/668,241, filed Aug. 3, 2017, 19 Pages.
Final Office Action dated Oct. 18, 2021 for U.S. Appl. No. 16/716,050, filed Dec. 16, 2019, 18 Pages.
Final Office Action dated Oct. 21, 2021 for U.S. Appl. No. 16/421,441, filed May 23, 2019, 23 Pages.
Final Office Action dated Dec. 26, 2019 for U.S. Appl. No. 15/801,216, filed Nov. 1, 2017, 5 Pages.
Final Office Action dated Feb. 27, 2020 for U.S. Appl. No. 16/177,971, filed Nov. 1, 2018, 9 Pages.
Final Office Action dated Jan. 27, 2021 for U.S. Appl. No. 16/255,528, filed Jan. 23, 2019, 31 Pages.
Final Office Action dated Jul. 28, 2021 for U.S. Appl. No. 17/083,920, filed Oct. 29, 2020, 19 Pages.
Final Office Action dated Apr. 29, 2020 for U.S. Appl. No. 15/719,345, filed Sep. 28, 2017, 14 Pages.
International Preliminary Report on Patentability for International Application No. PCT/US2018/039350, dated Jan. 9, 2020, 10 Pages.
International Search Report and Written Opinion for International Application No. PCT/US2018/039350, dated Nov. 15, 2018, 11 Pages.
International Search Report and Written Opinion for International Application No. PCT/US2018/039352, dated Oct. 26, 2018, 8 Pages.
International Search Report and Written Opinion for International Application No. PCT/US2018/039431, dated Nov. 7, 2018, 12 Pages.
International Search Report and Written Opinion for International Application No. PCT/US2018/045661, dated Nov. 30, 2018, 11 Pages.
International Search Report and Written Opinion for International Application No. PCT/US2018/045666, dated Dec. 3, 2018, 13 Pages.

(56) References Cited

OTHER PUBLICATIONS

International Search Report and Written Opinion for International Application No. PCT/US2018/045673, dated Dec. 4, 2018, 13 Pages.
International Search Report and Written Opinion for International Application No. PCT/US2018/046131, dated Dec. 3, 2018, 10 Pages.
International Search Report and Written Opinion for International Application No. PCT/US2018/064181, dated Mar. 29, 2019, 10 Pages.
International Search Report and Written Opinion for International Application No. PCT/US2019/014044, dated May 8, 2019, 9 Pages.
International Search Report and Written Opinion for International Application No. PCT/US2019/014904, dated Aug. 5, 2019, 7 Pages.
International Search Report and Written Opinion for International Application No. PCT/US2019/019756, dated Jun. 13, 2019, 11 Pages.
International Search Report and Written Opinion for International Application No. PCT/US2019/019765, dated Jun. 14, 2019, 9 Pages.
International Search Report and Written Opinion for International Application No. PCT/US2019/025170, dated Jul. 9, 2019, 11 Pages.
International Search Report and Written Opinion for International Application No. PCT/US2019/027727, dated Jun. 27, 2019, 10 Pages.
International Search Report and Written Opinion for International Application No. PCT/US2019/027729, dated Jun. 27, 2019, 9 Pages.
International Search Report and Written Opinion for International Application No. PCT/US2019/031521, dated Jul. 11, 2019, 8 Pages.
International Search Report and Written Opinion for International Application No. PCT/US2019/034007, dated Oct. 28, 2019, 18 Pages.
International Search Report and Written Opinion for International Application No. PCT/US2019/035724, dated Sep. 10, 2019, 11 Pages.
International Search Report and Written Opinion for International Application No. PCT/US2019/036484, dated Sep. 19, 2019, 9 Pages.
International Search Report and Written Opinion for International Application No. PCT/US2019/036492, dated Sep. 25, 2019, 8 Pages.
International Search Report and Written Opinion for International Application No. PCT/US2019/036536, dated Sep. 26, 2019, 13 Pages.
International Search Report and Written Opinion for International Application No. PCT/US2019/036575, dated Sep. 30, 2019, 15 Pages.
International Search Report and Written Opinion for International Application No. PCT/US2019/039410, dated Sep. 30, 2019, 10 Pages.
International Search Report and Written Opinion for International Application No. PCT/US2019/039758, dated Oct. 11, 2019, 12 Pages.
International Search Report and Written Opinion for International Application No. PCT/US2019/047156, dated Oct. 23, 2019, 9 Pages.
International Search Report and Written Opinion for International Application No. PCT/US2019/048241, dated Jan. 28, 2020, 16 Pages.
International Search Report and Written Opinion for International Application No. PCT/US2019/049756, dated Dec. 16, 2019, 8 pages.
International Search Report and Written Opinion for International Application No. PCT/US2019/059754, dated Mar. 24, 2020, 11 Pages.
International Search Report and Written Opinion for International Application No. PCT/US2019/065430, dated Mar. 6, 2020, 11 Pages.
International Search Report and Written Opinion for International Application No. PCT/US2019/066805, dated Mar. 6, 2020, 9 Pages.
International Search Report and Written Opinion for International Application No. PCT/US2019/066831, dated Feb. 27, 2020, 11 Pages.
International Search Report and Written Opinion for International Application No. PCT/US2020/044807, dated Sep. 30, 2020, 12 Pages.
International Search Report and Written Opinion for International Application No. PCT/US2020/058097, dated Feb. 12, 2021, 09 Pages.
International Search Report and Written Opinion for International Application No. PCT/US2020/059636, dated Feb. 11, 2021, 18 Pages.
International Search Report and Written Opinion for International Application No. PCT/US2021/031201, dated Aug. 2, 2021, 13 Pages.
International Search Report and Written Opinion for International Application No. PCT/US2021/033321, dated Sep. 6, 2021, 11 pages.
International Search Report and Written Opinion for International Application No. PCT/US2021/041775, dated Nov. 29, 2021, 14 pages.
Kavusi S., et al., "Quantitative Study of High-Dynamic-Range Image Sensor Architecture," Proceedings of Society of Photo-Optical Instrumentation Engineers, Jun. 7, 2004, vol. 5301, 12 Pages, XP055186908.
Millet L., et al., "A 5500-Frames/s 85-GOPS/W 3-D Stacked BSI Vision Chip Based on Parallel In-Focal-Plane Acquisition and Processing," IEEE Journal of Solid-State Circuits, USA, Apr. 1, 2019, vol. 54 (4), pp. 1096-1105, XP011716786.
Non-Final Office Action dated Feb. 1, 2021 for U.S. Appl. No. 16/435,451, filed Jun. 7, 2019, 14 Pages.
Non-Final Office Action dated Jan. 1, 2021 for U.S. Appl. No. 16/715,792, filed Dec. 16, 2019, 15 Pages.
Non-Final Office Action dated May 1, 2019 for U.S. Appl. No. 15/927,896, filed Mar. 21, 2018, 10 Pages.
Non-Final Office Action dated May 1, 2020 for U.S. Appl. No. 16/384,720, filed Apr. 15, 2019, 6 Pages.
Non-Final Office Action dated Oct. 1, 2019 for U.S. Appl. No. 16/286,355, filed Feb. 26, 2019, 6 Pages.
Non-Final Office Action dated Oct. 1, 2019 for U.S. Appl. No. 16/566,583, filed Sep. 10, 2019, 10 Pages.
Non-Final Office Action dated Jul. 2, 2021 for U.S. Appl. No. 16/820,594, filed Mar. 16, 2020, 8 Pages.
Non-Final Office Action dated Sep. 2, 2021 for U.S. Appl. No. 16/910,844, filed Jun. 24, 2020, 7 Pages.
Non-Final Office Action dated Dec. 4, 2020 for U.S. Appl. No. 16/436,137, filed Jun. 10, 2019, 12 Pages.
Non-Final Office Action dated Mar. 4, 2020 for U.S. Appl. No. 16/436,049, filed Jun. 10, 2019, 9 Pages.
Non-Final Office Action dated May 7, 2021 for U.S. Appl. No. 16/421,441, filed May 23, 2019, 17 Pages.
Non-Final Office Action dated Jun. 8, 2021 for U.S. Appl. No. 17/072,840, filed Oct. 16, 2020, 7 Pages.
Non-Final Office Action dated Jul. 10, 2019 for U.S. Appl. No. 15/861,588, filed Jan. 3, 2018, 11 Pages.
Non-Final Office Action dated Jul. 10, 2020 for U.S. Appl. No. 16/255,528, filed Jan. 23, 2019, 27 Pages.
Non-Final Office Action dated May 14, 2021 for U.S. Appl. No. 16/716,050, filed Dec. 16, 2019, 16 Pages.
Non-Final Office Action dated Mar. 15, 2021 for U.S. Appl. No. 16/896,130, filed Jun. 8, 2020, 16 Pages.
Non-Final Office Action dated Sep. 18, 2019 for U.S. Appl. No. 15/876,061, filed Jan. 19, 2018, 23 Pages.
Non-Final Office Action dated Apr. 21, 2021 for U.S. Appl. No. 16/453,538, filed Jun. 26, 2019, 16 Pages.
Non-Final Office Action dated Apr. 21, 2021 for U.S. Appl. No. 17/083,920, filed Oct. 29, 2020, 17 Pages.
Non-Final Office Action dated Dec. 21, 2018 for U.S. Appl. No. 15/668,241, filed Aug. 3, 2017, 16 Pages.
Non-Final Office Action dated Oct. 21, 2021 for U.S. Appl. No. 17/083,920, filed Oct. 29, 2020, 19 Pages.

(56) References Cited

OTHER PUBLICATIONS

Non-Final Office Action dated Jul. 22, 2020 for U.S. Appl. No. 16/249,420, filed Jan. 16, 2019, 9 Pages.
Non-Final Office Action dated Jul. 22, 2020 for U.S. Appl. No. 16/369,763, filed Mar. 29, 2019, 15 Pages.
Non-Final Office Action dated Sep. 22, 2020 for U.S. Appl. No. 16/707,988, filed Dec. 9, 2019, 15 Pages.
Non-Final Office Action dated Nov. 23, 2018 for U.S. Appl. No. 15/847,517, filed Dec. 19, 2017, 21 Pages.
Non-Final Office Action dated Jul. 25, 2019 for U.S. Appl. No. 15/909,162, filed Mar. 1, 2018, 20 Pages.
Non-Final Office Action dated Nov. 25, 2019 for U.S. Appl. No. 15/719,345, filed Sep. 28, 2017, 14 Pages.
Non-Final Office Action dated Sep. 25, 2019 for U.S. Appl. No. 16/177,971, filed Nov. 1, 2018, 9 Pages.
Non-Final Office Action dated Apr. 27, 2021 for U.S. Appl. No. 16/829,249, filed Mar. 25, 2020, 9 Pages.
Non-Final Office Action dated Jul. 27, 2020 for U.S. Appl. No. 16/566,583, filed Sep. 10, 2019, 11 Pages.
Non-Final Office Action dated Jun. 27, 2019 for U.S. Appl. No. 15/801,216, filed Nov. 1, 2017, 13 Pages.
Non-Final Office Action dated Aug. 29, 2019 for U.S. Appl. No. 15/983,391, filed May 18, 2018, 12 Pages.
Non-Final Office Action dated Jan. 30, 2020 for U.S. Appl. No. 16/431,693, filed Jun. 4, 2019, 6 Pages.
Non-Final Office Action dated Jun. 30, 2020 for U.S. Appl. No. 16/436,049, filed Jun. 10, 2019, 11 Pages.
Non-Final Office Action dated Jan. 31, 2020 for U.S. Appl. No. 16/210,748, filed Dec. 5, 2018, 11 Pages.
Notice of Allowability dated May 6, 2020 for U.S. Appl. No. 15/876,061, filed Jan. 19, 2018, 2 Pages.
Notice of Allowance dated Apr. 1, 2021 for U.S. Appl. No. 16/255,528, filed Jan. 23, 2019, 7 Pages.
Notice of Allowance dated May 1, 2019 for U.S. Appl. No. 15/847,517, filed Dec. 19, 2017, 11 Pages.
Notice of Allowance dated Nov. 2, 2021 for U.S. Appl. No. 16/453,538, filed Jun. 26, 2019, 8 Pages.
Notice of Allowance dated Nov. 3, 2020 for U.S. Appl. No. 16/566,583, filed Sep. 10, 2019, 11 Pages.
Notice of Allowance dated Sep. 3, 2020 for U.S. Appl. No. 15/719,345, filed Sep. 28, 2017, 12 Pages.
Notice of Allowance dated Feb. 4, 2020 for U.S. Appl. No. 15/876,061, filed Jan. 19, 2018, 13 Pages.
Notice of Allowance dated Jun. 4, 2020 for U.S. Appl. No. 16/286,355, filed Feb. 26, 2019, 7 Pages.
Notice of Allowance dated Mar. 5, 2020 for U.S. Appl. No. 15/668,241, filed Aug. 3, 2017, 8 Pages.
Notice of Allowance dated May 5, 2021 for U.S. Appl. No. 16/707,988, filed Dec. 9, 2019, 14 Pages.
Notice of Allowance dated Jan. 7, 2022 for U.S. Appl. No. 16/899,908, filed Jun. 12, 2020, 10 pages.
Notice of Allowance dated Apr. 8, 2020 for U.S. Appl. No. 15/983,391, filed May 18, 2018, 8 Pages.
Notice of Allowance dated Dec. 8, 2021 for U.S. Appl. No. 16/829,249, filed Mar. 25, 2020, 6 pages.
Notice of Allowance dated Jul. 8, 2021 for U.S. Appl. No. 17/150,925, filed Jan. 15, 2021, 10 Pages.
Notice of Allowance dated Jul. 9, 2020 for U.S. Appl. No. 16/454,787, filed Jun. 27, 2019, 9 Pages.
Notice of Allowance dated Sep. 9, 2020 for U.S. Appl. No. 16/454,787, filed Jun. 27, 2019, 9 Pages.
Notice of Allowance dated Jun. 11, 2020 for U.S. Appl. No. 16/382,015, filed Apr. 11, 2019, 11 Pages.
Notice of Allowance dated Aug. 12, 2020 for U.S. Appl. No. 15/719,345, filed Sep. 28, 2017, 10 Pages.
Notice of Allowance dated Feb. 12, 2020 for U.S. Appl. No. 16/286,355, filed Feb. 26, 2019, 7 Pages.
Notice of Allowance dated Jul. 13, 2021 for U.S. Appl. No. 16/896,130, filed Jun. 8, 2020, 8 Pages.
Notice of Allowance dated Oct. 14, 2020 for U.S. Appl. No. 16/384,720, filed Apr. 15, 2019, 8 Pages.
Notice of Allowance dated Oct. 15, 2020 for U.S. Appl. No. 16/544,136, filed Aug. 19, 2019, 11 Pages.
Notice of Allowance dated Apr. 16, 2021 for U.S. Appl. No. 16/715,792, filed Dec. 16, 2019, 10 Pages.
Notice of Allowance dated Sep. 16, 2020 for U.S. Appl. No. 16/435,449, filed Jun. 7, 2019, 7 Pages.
Notice of Allowance dated Nov. 17, 2021 for U.S. Appl. No. 16/899,908, filed Jun. 12, 2020, 7 Pages.
Notice of Allowance dated Sep. 17, 2021 for U.S. Appl. No. 16/899,908, filed Jun. 12, 2020, 11 Pages.
Notice of Allowance dated Mar. 18, 2020 for U.S. Appl. No. 15/909,162, filed Mar. 1, 2018, 9 Pages.
Notice of Allowance dated Nov. 18, 2020 for U.S. Appl. No. 16/249,420, filed Jan. 16, 2019, 8 Pages.
Notice of Allowance dated Oct. 18, 2019 for U.S. Appl. No. 15/983,379, filed May 18, 2018, 9 Pages.
Notice of Allowance dated Dec. 21, 2021 for U.S. Appl. No. 16/550,851, filed Aug. 26, 2019, 10 pages.
Notice of Allowance dated Oct. 21, 2020 for U.S. Appl. No. 16/436,049, filed Jun. 10, 2019, 8 Pages.
Notice of Allowance dated Apr. 22, 2020 for U.S. Appl. No. 16/454,787, filed Jun. 27, 2019, 10 Pages.
Notice of Allowance dated Dec. 22, 2021 for U.S. Appl. No. 16/910,844, filed Jun. 24, 2020, 7 pages.
Notice of Allowance dated Jan. 22, 2021 for U.S. Appl. No. 16/369,763, filed Mar. 29, 2019, 8 Pages.
Notice of Allowance dated Nov. 22, 2021 for U.S. Appl. No. 16/820,594, filed Mar. 16, 2020, 18 pages.
Notice of Allowance dated Nov. 22, 2021 for U.S. Appl. No. 16/820,594, filed Mar. 16, 2020, 8 pages.
Notice of Allowance dated Jun. 23, 2020 for U.S. Appl. No. 15/801,216, filed Nov. 1, 2017, 5 Pages.
Notice of Allowance dated Apr. 24, 2020 for U.S. Appl. No. 16/177,971, filed Nov. 1, 2018, 6 Pages.
Notice of Allowance dated Jun. 24, 2020 for U.S. Appl. No. 16/431,693, filed Jun. 4, 2019, 7 Pages.
Notice of Allowance dated Nov. 24, 2021 for U.S. Appl. No. 16/910,844, filed Jun. 24, 2020, 8 pages.
Notice of Allowance dated Aug. 25, 2021 for U.S. Appl. No. 16/715,792, filed Dec. 16, 2019, 9 Pages.
Notice of Allowance dated Oct. 25, 2021 for U.S. Appl. No. 16/435,451, filed Jun. 7, 2019, 8 Pages.
Notice of Allowance dated Aug. 26, 2020 for U.S. Appl. No. 16/384,720, filed Apr. 15, 2019, 8 Pages.
Notice of Allowance dated Nov. 26, 2019 for U.S. Appl. No. 15/861,588, filed Jan. 3, 2018, 9 Pages.
Notice of Allowance dated Oct. 26, 2021 for U.S. Appl. No. 16/896,130, filed Jun. 8, 2020, 8 Pages.
Notice of Allowance dated Jul. 27, 2020 for U.S. Appl. No. 16/435,449, filed Jun. 7, 2019, 8 Pages.
Notice of Allowance dated Jun. 29, 2020 for U.S. Appl. No. 15/668,241, filed Aug. 3, 2017, 8 Pages.
Notice of Allowance dated Aug. 30, 2021 for U.S. Appl. No. 16/829,249, filed Mar. 25, 2020, 8 pages.
Notice of Reason for Rejection dated Nov. 16, 2021 for Japanese Application No. 2019-571699, filed Jun. 25, 2018, 13 pages.
Office Action dated Jul. 3, 2020 for Chinese Application No. 201810821296, filed Jul. 24, 2018, 17 Pages.
Office Action dated Jul. 7, 2021 for European Application No. 19723902.3, filed Apr. 1, 2019, 3 Pages.
Office Action dated Jul. 7, 2021 for European Application No. 19737299.8, filed Jun. 11, 2019, 5 Pages.
Office Action dated Mar. 9, 2021 for Chinese Application No. 201810821296, filed Jul. 24, 2018, 10 Pages.
Office Action dated Aug. 14, 2019 for European Application No. 18188968.4, filed Aug. 14, 2018, 5 Pages.
Office Action dated Dec. 14, 2021 for Japanese Application No. 2019571598, filed Jun. 26, 2018, 12 pages.
Office Action dated Nov. 26, 2019 for European Application No. 18188684.7, filed Aug. 13, 2018, 9 Pages.

(56) References Cited

OTHER PUBLICATIONS

Office Action dated Aug. 28, 2019 for European Application No. 18188962.7, filed Aug. 14, 2018, 6 Pages.
Office Action dated Jun. 28, 2020 for Chinese Application No. 201810821296, filed Jul. 24, 2018, 2 Pages.
Partial European Search Report for European Application No. 18179838.0, dated Dec. 5, 2018, 13 Pages.
Partial International Search Report and Provisional Opinion for International Application No. PCT/US2021/041775, dated Oct. 8, 2021, 12 pages.
Restriction Requirement dated Feb. 2, 2021 for U.S. Appl. No. 16/716,050, filed Dec. 16, 2019, 7 Pages.
Sebastian A., et al., "Memory Devices and Applications for In-memory Computing," Nature Nanotechnology, Nature Publication Group, Inc, London, Mar. 30, 2020, vol. 15 (7), pp. 529-544, XP037194929.
Shi C., et al., "A 1000fps Vision Chip Based on a Dynamically Reconfigurable Hybrid Architecture Comprising a PE Array and Self-Organizing Map Neural Network," International Solid-State Circuits Conference, Session 7, Image Sensors, Feb. 10, 2014, pp. 128-130, XP055826878.
Snoeij M.F., et al., "A low Power Column-Parallel 12-bit ADC for CMOS Imagers," XP007908033, Jun. 1, 2005, pp. 169-172.
Snoeij M.F., et al., "A Low-Power Column-Parallel 12-bit ADC for CMOS Imagers," Harvestimaging [online], Proceedings IEEE Workshop on Charge-Coupled Devices and Advanced Image Sensors (CCDS & AIS), Published date: Jun. 1, 2005, pp. 169-172, XP007908033, Retrieved from the Internet: URL: http://www.harvestimaging.com/pubdocs/084_2005_june_workshop.pdf.
Supplemental Notice of Allowability dated Apr. 29, 2020 for U.S. Appl. No. 15/668,241, filed Aug. 3, 2017, 5 Pages.
Tanner S., et al., "Low-Power Digital Image Sensor for Still Picture Image Acquisition," Visual Communications and Image Processing, San Jose, Jan. 22, 2001, vol. 4306, pp. 358-365, XP008014232.
Xu C., et al., "A New Digital-Pixel Architecture for CMOS Image Sensor with Pixel-Level ADC and Pulse Width Modulation using a 0.18 um CMOS Technology," Electron Devices and Solid-State Circuits, IEEE Conference on Kowloon, Hong Kong, Piscataway, NJ, USA, Dec. 16, 2003, pp. 265-268, XP010695857.
International Search Report and Written Opinion for International Application No. PCT/US2021/057966, dated Feb. 22, 2022, 15 pages.
Corrected Notice of Allowability mailed Jan. 9, 2023 for U.S. Appl. No. 17/150,925, filed Jan. 15, 2021, 8 pages.
Final Office Action mailed Dec. 2, 2022 for U.S. Appl. No. 17/072,840, filed Oct. 16, 2020, 9 pages.
Notice of Allowance mailed Mar. 1, 2023 for U.S. Appl. No. 17/242,152, filed Apr. 27, 2021, 9 pages.
Notice of Allowance mailed Dec. 6, 2022 for U.S. Application No. 16/896,130, filed Jun. 8, 2020, 8 pages.
Notice of Allowance mailed Dec. 9, 2022 for U.S. Appl. No. 16/435,451, filed Jun. 7, 2019, 8 pages.
Notice of Allowance mailed Feb. 10, 2023 for U.S. Appl. No. 16/899,908, filed Jun. 12, 2020, 9 pages.
Notice of Allowance mailed Dec. 13, 2022 for U.S. Appl. No. 16/820,594, filed Mar. 16, 2020, 5 pages.
Notice of Allowance mailed Mar. 17, 2023 for U.S. Appl. No. 16/896,130, filed Jun. 8, 2020, 8 pages.
Notice of Allowance mailed Nov. 21, 2022 for U.S. Appl. No. 17/242,152, filed Apr. 27, 2021, 10pages.
Notice of Allowance mailed Oct. 21, 2022 for U.S. Appl. No. 16/899,908, filed Jun. 12, 2020, 10 pages.
Office Action mailed Nov. 2, 2022 for Taiwan Application No. 107128759, filed Aug. 17, 2018, 16 pages.
Office Action mailed Dec. 1, 2022 for Korean Application No. 10-2020-7002306, filed Jun. 25, 2018, 13 pages.
Office Action mailed Nov. 1, 2022 for Japanese Patent Application No. 2020-520431, filed Jun. 25, 2018, 11 pages.
Office Action mailed Nov. 15, 2022 for Taiwan Application No. 108120143, filed Jun. 11, 2019, 8 pages.
Office Action mailed Sep. 29, 2022 for Taiwan Application No. 108122878, filed Jun. 28, 2019, 9 pages.
Office Action mailed Jan. 5, 2023 for Chinese Application No. 201980043907.7, filed Jun. 28, 2019, 14 pages.
Office Action mailed Feb. 7, 2023 for Japanese Application No. 2019-571699, filed Jun. 25, 2018, 5 pages.
International Preliminary Report on Patentability for International Application No. PCT/US2021/054327, mailed Apr. 20, 2023, 7 pages.
International Preliminary Report on Patentability for International Application No. PCT/US2021/057966, mailed May 19, 2023, 12 pages.
International Preliminary Report on Patentability for International Application No. PCT/US2021/065174 mailed Jul. 13, 2023, 9 pages.
Notice of Allowance mailed Jun. 1, 2023 for U.S. Appl. No. 16/899,908, filed Jun. 12, 2020, 9 pages.
Notice of Allowance mailed Jul. 7, 2023 for U.S. Appl. No. 16/896,130, filed Jun. 8, 2020, 8 pages.
Notice of Allowance mailed Apr. 13, 2023 for U.S. Appl. No. 17/072,840, filed Oct. 16, 2020, 6 pages.
Notice of Allowance mailed Jun. 16, 2023 for U.S. Appl. No. 17/242,152, filed Apr. 27, 2021, 9 pages.
Notice of Allowance mailed Jun. 22, 2023 for U.S. Appl. No. 16/435,451, filed Jun. 7, 2019, 10 pages.
Notice of Allowance mailed Mar. 27, 2023 for U.S. Appl. No. 16/820,594, filed Mar. 16, 2020, 5 pages.
Office Action mailed Jun. 1, 2023 for Korean Application No. 10-2020-7002306, filed Jun. 25, 2018, 3 pages.
Office Action mailed Mar. 10, 2023 for Chinese Application No. 201880053600.0, filed Jun. 25, 2018, 10 pages.
Office Action mailed Feb. 15, 2023 for Chinese Application No. 201980049477.X, filed Jun. 11, 2019, 19 pages.
Office Action mailed Mar. 16, 2023 for Korean Patent Application No. 10-2020-7002496, filed Jun. 26, 2018, 3 pages.
Office Action mailed Jul. 4, 2023 for Japanese Application No. 2019571598, filed Jun. 26, 2018, 34 pages.
Office Action mailed May 9, 2023 for Japanese Patent Application No. 2020-5204312, filed Jun. 25, 2018, 6 pages.
Office Action mailed May 9, 2023 for Japanese Patent Application No. 2020-563959, filed Nov. 12, 2020, 5 pages.
Corrected Notice of Allowance mailed Aug. 9, 2023 for U.S. Appl. No. 17/072,840, filed Oct. 16, 2020, 3 pages.
Non-Final Office Action mailed Oct. 16, 2023 for U.S. Appl. No. 17/554,896, filed Dec. 17, 2021, 15 pages.
Notice of Allowance mailed Nov. 1, 2023 for U.S. Appl. No. 16/820,594, filed Mar. 16, 2020, 5 pages.
Notice of Allowance mailed Oct. 2, 2023 for U.S. Appl. No. 16/435,451, filed Jun. 7, 2019, 10 pages.
Notice of Allowance mailed Oct. 4, 2023 for U.S. Appl. No. 17/242,152, filed Apr. 27, 2021, 9 pages.
Notice of Allowance mailed Sep. 13, 2023 for U.S. Appl. No. 16/899,908, filed Jun. 12, 2020, 9 pages.
Notice of Allowance mailed Jul. 19, 2023 for U.S. Appl. No. 16/820,594, filed Mar. 16, 2020, 5 pages.
Notice of Allowance mailed Oct. 26, 2023 for U.S. Appl. No. 16/896,130, filed Jun. 8, 2020, 8 pages.
Notice of Allowance mailed Oct. 27, 2023 for U.S. Appl. No. 17/072,840, filed Oct. 16, 2020, 10 pages.
Notice of Allowance mailed Jul. 31, 2023 for U.S. Appl. No. 17/072,840, filed Oct. 16, 2020, 6 pages.
Office Action mailed Jul. 4, 2023 for Korean Application No. 10-2020-7002533, filed Jun. 25, 2018, 3 pages.

* cited by examiner

DIGITAL PIXEL SENSOR HAVING REDUCED QUANTIZATION OPERATION

This application claims priority to U.S. provisional patent application Ser. No. 63/089,704, filed Oct. 9, 2020 entitled, "DIGITAL PIXEL SENSOR HAVING REDUCED QUANTIZATION OPERATION," which is hereby expressly incorporated by reference in its entirety.

BACKGROUND

A typical image sensor includes an array of pixel cells. Each pixel cell may include a photodiode to sense light by converting photons into charge (e.g., electrons or holes). The image sensor may also include an integrated circuit configured to store the charge generated, and send the charge to an analog-to-digital converter (ADC). The ADC will convert the stored charge into digital values (i.e., "quantize" the charge), as part of processes for digital image generation. To accurately represent an environment from which the pixel cells receive light, the pixel cells must generate, store, and convert sufficient charge from the photons over a period of exposure time.

SUMMARY

The present disclosure relates to image sensors. More specifically, and without limitation, this disclosure relates to a digital image sensor incorporating pixel cells including an integrated circuit configured to reduce power consumption when quantizing a charge while preserving the dynamic range of the digital image sensor (i.e., the range of light values that a sensor may generate and output).

In some examples, an apparatus is provided. The apparatus includes: a pixel cell configured to generate a voltages, the pixel cell including a photodiode configured to generate charge in response to incoming light, and a charge storage device to convert the charge to a voltage; an integrated circuit configured to: determine a first captured voltage converted by the charge storage device during a first time period; compare the first captured voltage to a threshold voltage value; and in response to determining that the first captured voltage meets or exceeds the threshold voltage value: determine first time data corresponding to the first time period; and prevent the charge storage device from further generating a charge; and an analog-to-digital converter (ADC) configured to generate a digital pixel value based on the first captured voltage, and a memory to store the digital pixel value and the first time data.

In some aspects, the integrated circuit comprises a latch, and the photodiode of the pixel cell is coupled to the charge storage device of the pixel cell via the latch. In some further aspects, the latch enables the charge storage device to accumulate charge when the latch is closed, and the latch prevents the charge storage device from accumulating charge when the latch is open. In some further aspects, the integrated circuit comprises a comparator configured to receive the first captured voltage from the charge storage device and compare the first captured voltage to the threshold voltage value.

In some further aspects the operational amplifier is further configured to output a comparative signal to the latch, wherein the latch is opened in response to receiving a signal from the operative amplifier indicating the first captured voltage from the charge storage device meets or exceeds the threshold voltage value. In some aspects, the apparatus includes one or more sense amplifiers configured to amplify the stored digital pixel value prior to exporting the stored pixel value off of the apparatus.

In some aspects the first time data is a binary flag field representing a plurality of time periods including the first time period and at least a second time period, and the integrated circuit is further configured to store the binary flag value and the first captured voltage. In some further embodiments, the plurality of time periods are determined based on a type of the photodiode, the type of the photodiode indicating a rate of charge generation based on incoming light intensity. In some further aspects, the plurality of time periods are determined based on a target dynamic range of the sensor apparatus.

In some aspects, the second time period occurs prior to the first time period and the integrated circuit is further configured to determine a second captured voltage converted by the charge storage device at the second time period. In some further aspects, the integrated circuit is further configured to compare the second captured voltage converted by the charge storage device at the second time period to the threshold voltage value. In some further aspects, the integrated circuit is configured to, in response to determining that the second captured voltage does not meet or exceed the threshold voltage value, update the binary flag field. In some further aspects, the binary flag is a one-bit binary flag corresponding to the first and second time periods. In some further aspects, the binary flag is a two-bit binary flag corresponding to the first and second time periods and a third and fourth time period, the third and fourth time period occurring subsequent to the first time period.

In some aspects, the integrated circuit is further configured to receive the threshold voltage value prior to comparing the first captured voltage to the threshold voltage value. In some further aspects, the integrated circuit receives the threshold voltage value from an ADC ramp generator. In some further aspects, the sensor apparatus further comprises an integrated circuit periphery coupled to the integrated circuit, the integrated circuit periphery comprises the ADC ramp generator, and the ADC ramp generator in configured to determine the threshold voltage value based on a ramp input received at the ADC ramp generator. In some further aspects, the integrated circuit periphery is further coupled to an application instance, the application instance configured to determine the ramp input based on one or more features of a scene and send the ramp input to the ADC ramp generator. In some further aspects, the one or more features of a scene are generated based on one or more of an environmental sensor, a motion sensor, and a generative model.

In some examples, a method includes generating a voltage by converting charges based on incoming light received at a photodiode; determining a first captured voltage generated during a first time period; comparing the first captured voltage to a threshold voltage value; in response to determining that the first captured voltage meets or exceeds the threshold voltage value: determining first time data corresponding to the first time period; and preventing further accumulation of charge; and converting the first captured voltage and the first time data to digital pixel data comprising one or more digital pixel values.

BRIEF DESCRIPTION OF THE DRAWINGS

Illustrative embodiments are described with reference to the following figures.

Figure 1:
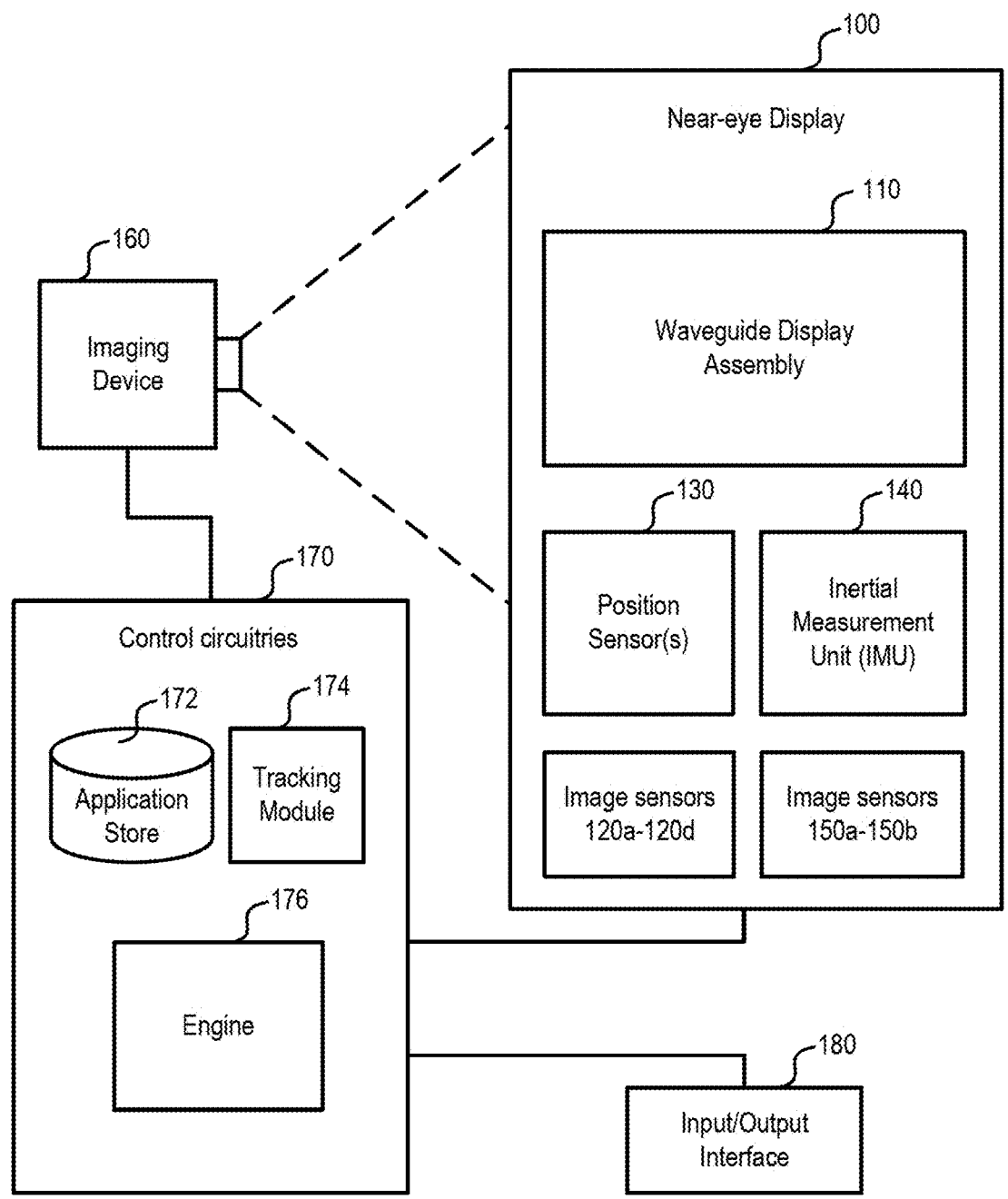
FIG. 1 is a block diagram of an embodiment of a system including the near-eye display.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

A typical image sensor includes an array of pixel cells. Each pixel cell includes a photodiode to sense incident light by converting photons into charge (e.g., electrons or holes). The charge generated by photodiodes of the array of pixel cells can then be quantized by an analog-to-digital converter (ADC) into digital values. The ADC can quantize the charge by, for example, using a comparator to compare a voltage representing the charge with one or more quantization levels, and a digital value can be generated based on the comparison result. The digital value can then be stored in a memory and then used to generate a digital image.

The digital image data can support various wearable applications, such as object recognition and tracking, location tracking, augmented reality (AR), virtual reality (VR), etc. These and other applications may utilize extraction techniques to extract, from a subset of pixels of the digital image, aspects of the digital image (i.e., light levels, scenery, semantic regions) and/or features of the digital image (i.e., objects and entities represented in the digital image). For example, an application can identify pixels of reflected structured light (e.g., dots), compare a pattern extracted from the pixels with the transmitted structured light, and perform depth computation based on the comparison.

The application can also identify 2D pixel data from the same pixel cells that provide the extracted pattern of structured light to perform fusion of 2D and 3D sensing. To perform object recognition and tracking, an application can also identify pixels of image features of the object, extract the image features from the pixels, and perform the recognition and tracking based on the extraction results. These applications are typically executed on a host processor, which can be electrically connected with the image sensor and receive the pixel data via interconnects. The host processor, the image sensor, and the interconnects can be part of a wearable device.

Contemporary digital image sensors are complex apparatuses that convert light into digital image data. The efficiency and power of a digital image sensor are important factors in the integration of digital image sensors into various devices and applications. For example, efficient sensor function (e.g., consuming as little power as possible during its regular operations) is a highly desirable trait for digital image sensors embedded in consumer devices, especially wireless, battery-operated devices (e.g. wearable devices) that operate with limited power availability. At the same time, a powerful digital image sensor (e.g., a sensor that may output a wider dynamic range of colors captured at a photodiode) is also desirable for use in a wide range of applications (e.g., more accurate and visually pleasing AR/VR applications).

A digital image sensor must strike a balance between power and efficiency, as a higher dynamic range of sensor capture capability requires additional power to maintain. For example, a sensor with a higher dynamic range of representable light intensities will often perform multiple quantization operations for a captured charge at intervals per frame captured. This consumes more power per frame processed and requires more embedded transistors within each pixel of the sensor to function. Though multiple quantization operations can provide for more accurate and higher ranges of colors captured, each quantization operation consumes a relatively high amount of power compared to other pixel cell functions. Additional power is also required to store and process charges generated at a photodiode. Thus, each additional component and operation in a typical pixel cell for facilitating a high dynamic range (HDR) sensor requires more space on integrated sensor circuits and consumes additional power, making the sensor less efficient. In contrast, low dynamic range sensors may require less energy to operate (i.e., less quantization operations are performed), but the resulting dynamic range that can be achieved by the sensor is limited.

This disclosure relates to a digital image sensor utilizing single quantization operations and time-based pixel charge threshold processing operations. More specifically, a digital image sensor may include an integrated processing circuit for determining if a charge storage device has generated sufficient charge compared to a desired charge threshold during multiple time periods of a frame capture. Once the charge storage device has sufficiently converted a charge (i.e. the charge stored by the charge storage device is above the desired threshold of stored charge), a logical circuit may prevent further charge storage and may record a time period at which sufficient charge has been captured. Because power is consumed as a charge storage device stores charge converted from a photodiode, any charge stored past the desired threshold causes unnecessary power consumption. Continued power consumption past a desired threshold also causes saturation of a pixel with light, which may cause distortions in the final digital image generated by the image sensor. Thus, it is desirable to only capture charges that meet a desired threshold and prevent capture beyond that point.

A time-based flag field may represent the time period during which the charge storage device is converting and storing charges from a photodiode. Because different wavelengths and intensities of light will generate a charge at different rates, the time-based flag field may be used to indicate a time at which light captured by a pixel cell has been converted into sufficient charge to represent the light intensity accurately in a digital image. For example, higher intensities of light captured will cause the charge storage device to reach the threshold charge faster than lower intensities of light. This time-based flag field may then be utilized as part of a single quantization operation to improve the dynamic range of the digital data output by the ADC. For example, if the time-based flag field indicates that the charge was sufficient as measured early in the frame capture, a downstream application may utilize the charge value stored and the flag to alter the manner in which a pixel value is represented in a downstream application. This allows the digital image sensor to perform a single quantization operation to reduce power consumption while preserving a higher dynamic range of operation at the downstream application.

In some examples, a sensor apparatus comprises a pixel cell configured to generate a voltage, the pixel cell including one or more photodiodes configured to generate a charge in response to light and a charge storage device to convert the charge to a voltage. The pixel cell may be configured as part of a system on chip (SOC) pixel and may be one pixel cell in an array of pixel cells. The pixel cell includes its own individual circuit with one or more photodiodes which will generate charge in response to receiving light. The amount of charge generated and stored may vary based on the intensity of the incoming light and the amount of time the photodiodes are exposed to the light. A charge storage device, such as a capacitor, will convert the charge generated at the one or more photodiodes into an analog voltage signal that can be used to generate pixel values, as discussed below.

In some examples, the sensor apparatus further comprises an integrated circuit built into an application-specific integrated circuit (ASIC) layer coupled to the SOC pixel. The integrated circuit includes components such as a comparator and a logical state latch to interact with and process the analog voltage signal captured by the charge storage device. For example, the integrated circuit may be configured to determine the captured voltage converted by the charge storage device at a first time period, compare the first captured voltage to a threshold voltage value, and in response to determining that the first captured voltage meets or exceeds the threshold voltage value, determine first time data corresponding to the first time period and prevent the charge storage device from further generating a charge.

The integrated circuit may be utilized in this manner to allow the charge storage device to capture the analog voltage signal until the voltage has equaled or surpassed a threshold voltage required to provide an sufficiently accurate representation of converted light from the photodiode." In other words, an analog voltage signal represented by a charge having a voltage value meeting or exceeding a desired threshold voltage value is "sufficiently charged." In other words, any charge less than the threshold value have an undesirably low signal-to-noise ratio, and any charge that is captured beyond the threshold level may cause undesirable saturation of the pixel.

Thus, the charge storage device may need to convert charges generated by the one or more photodiodes for a longer period of time to achieve sufficient charge when the one or more photodiodes are receiving dim light. On the other hand, continuing the convert and store a charge for a bright light will not only consume unnecessary power after the charge has reached a sufficient level, but the pixel may become saturated by intense light, causing noise or artifacts to appear in a final digital image. Once the charge storage device has reached a threshold amount of charge, the charge storage device may be separated from the photodiode to prevent further accumulation of charge, and thus, unnecessary consumption of power. The time at which saturation is achieved may be determined and used to store a binary flag bit corresponding to the charge to enable a higher dynamic range of representable values. For example, a computer memory may store both the charge value received as first value and a time-based binary flag bit based on the time at which the signal exceeded the threshold. These values may subsequently be used to represent a new pixel value in a higher dynamic range. For example, if two pixels each have a quantized value of 150, but the first pixel has a corresponding flag field value of "10," while the second pixel has a flag field value of "01," the first pixel may be represented differently in an output image than the second pixel.

In some examples, the sensor apparatus further comprises one or more analog-to-digital converters (ADC) configured the convert the captured voltages to digital pixel data comprising one or more digital pixel values. Specifically, the ADC may convert the analog voltage signal stored at the charge storage device into digital data including a digital pixel value representing the captured intensity of incoming light at the pixel cell (referred to as "quantizing" the analog voltage signal). The first time data is also stored to facilitate a higher dynamic range of values than the digital pixel data may represent. For example, first time data that indicates that the pixel cell stored sufficient charge very early in the time period for frame capture may indicate that the intensity of light was higher at capture. By storing both the pixel value and the first time data, they may be used to generate a high-dynamic range pixel value.

In some examples, the integrated circuit includes a state latch which may control whether the charge storage device is coupled to the photodiode in a contiguous circuit at a particular time. The state latch may be a logical latch including a 1-bit state latch configured to open or close the latch in response to a signal. For example, the charge storage device may convert the charges generated by the one or more photodiodes when the latch is in a closed state. This may occur while the charge storage device has still collected a sufficient level of voltage charge during exposure. Once the charge storage device has stored sufficient charge, the latch may open, thus removing the connection between the charge storage device and the photodiode, and preventing the charge storage device from further collecting charge. Thus, the pixel cell has generated sufficient charge to provide for an accurate pixel value, but will prevent further unnecessary power consumption and undesirable saturation of the pixel cell. The state latch may also be configured to send, to a memory on an integrated circuit, an indication of flag data to facilitate storage of the flag data.

The integrated circuit may further include a comparator to determine whether the charge storage device contains a voltage charge that is equal to or above a threshold voltage value. Thus, the comparator will determine if the voltage level of the captured charge meets or exceeds the threshold charge (i.e., the charge storage device has stored a sufficient charge for quantization), at a given time period. The comparator may include an operational amplifier that may receive the captured voltage from the charge storage device and the threshold voltage value. The comparator may then determine whether the captured voltage is greater than or equal to the threshold voltage value. If the comparator determines that the captured voltage does not meet or exceed the threshold voltage value, the comparator may not output a signal to save power, or may output a simple signal that the charge is not yet at a sufficient level. If the comparator determines that the captured voltage meets or exceeds the threshold voltage value, the comparator may output a signal to the latch to indicate that the latch should be opened to prevent continued charge storage and to store the then-current flag data.

The digital pixel sensor may further include one or more sense amplifiers configured to amplify the stored digital pixel value and flag data prior to exporting the values off of the digital pixel sensor. In some examples, the first time data used is representable as binary flag field data. The binary flag field data may represent a plurality of time periods during the capture of a frame. The binary flag field data may represent a number of time periods in multiples of 2 in this manner. For example, a binary "flag bit field" with a value of "11" may indicate that the current time period is a first time period out of four total time periods. Another flag bit field with a value of "101" may indicate that the current time period is a sixth time period out of eight total time periods. In this configuration, the value "0," "00,", "000," etc. indicates that the time period is the final time period before the conclusion of the frame capture and that the current analog voltage stored in the charge storage device should be quantized regardless of the current level of charge storage, though any suitable convention may be employed. The binary flag bit field is updated with each new time period in the frame capture time period and may be updated in response to determining that a captured voltage does not meet or exceed the threshold voltage. Further, not all values capable of being represented may be used. For example, a system may employ only three time periods, but may still employ 2-bit flag fields to represent the time periods. Alternatively, the systems described herein may dynamically change the bit-field width or number of values during operation, e.g., based on measured light intensities in prior captured images.

The number and duration of time periods that may be used for a frame capture may depend on some sensor configuration factors, such as the types of photodiodes in the pixel cell, the expected dynamic range of the sensor apparatus, a desired number of time periods per frame, etc. For example, for a photodiode that is less sensitive to light than other photodiodes, it may be desirable to increase the number of time periods or the duration of time periods to increase the chance that the pixel cells has stored sufficient charge as quickly as possible.

In some examples, the integrated circuit may be coupled to an ASIC periphery circuit on the digital image sensor. The periphery may include components for facilitating operations at the "edge" of the sensor (i.e., operations that involve input or output of data at the sensor by another separate component or apparatus). The periphery of the sensor may include a component for determining the threshold voltage value to send to the comparator. For example, an ADC ramp generator may itself send a ramping signal, based on a current relative time period, to the comparator to perform the comparison. The input threshold voltage value may be based on any factor or environment of the digital image sensor. For example, in response to determining that the digital pixel sensor resides in a low-light environment, the threshold voltage value may be set at a lower level to compensate for the expected low-light environment. In some embodiments, a software application communicating with the periphery may determine and send a threshold voltage value first to the periphery and then to the comparator.

In some examples, a method includes the processes described above with respect to the application system and the sensor apparatus. The disclosed techniques may include or be implemented in conjunction with an artificial reality system. Artificial reality is a form of reality that has been adjusted in some manner before presentation to a user, which may include, for example, a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, for example, create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1 is a block diagram of an embodiment of a system including the near-eye display 100. The system includes near-eye display 100, an imaging device 160, an input/output interface 180, and image sensors 120a-120d and 150a-150b that are each coupled to control circuitries 170. System 100 can be configured as a head-mounted device, a wearable device, etc.

Near-eye display 100 is a display that presents media to a user. Examples of media presented by the near-eye display 100 include one or more images, video, and/or audio. In some embodiments, audio is presented via an external device (e.g., speakers and/or headphones) that receives audio information from near-eye display 100 and/or control circuitries 170 and presents audio data based on the audio information to a user. In some embodiments, near-eye display 100 may also act as an AR eyewear glass. In some embodiments, near-eye display 100 augments views of a physical, real-world environment, with computer-generated elements (e.g., images, video, sound).

Near-eye display 100 includes waveguide display assembly 110, one or more position sensors 130, and/or an inertial measurement unit (IMU) 140. Waveguide display assembly 110 may include a source assembly, output waveguide, and controller.

IMU 140 is an electronic device that generates fast calibration data indicating an estimated position of near-eye display 100 relative to an initial position of near-eye display 100 based on measurement signals received from one or more of position sensors 130.

Imaging device 160 may generate image data for various applications. For example, imaging device 160 may generate image data to provide slow calibration data in accordance with calibration parameters received from control circuitries 170. Imaging device 160 may include, for example, image sensors 120a-120d for generating image data of a physical environment in which the user is located, for performing location tracking of the user. Imaging device 160 may further include, for example, image sensors 150a-150b for generating image data for determining a gaze point of the user, to identify an object of interest of the user.

The input/output interface 180 is a device that allows a user to send action requests to the control circuitries 170. An action request is a request to perform a particular action. For example, an action request may be to start or end an application or to perform a particular action within the application.

Control circuitries 170 provide media to near-eye display 100 for presentation to the user in accordance with information received from one or more of: imaging device 160, near-eye display 100, and input/output interface 180. In some examples, control circuitries 170 can be housed within system 100 configured as a head-mounted device. In some examples, control circuitries 170 can be a standalone console device communicatively coupled with other components of system 100. In the example shown in FIG. 1, control circuitries 170 include an application store 172, a tracking module 174, and an engine 176.

The application store 172 stores one or more applications for execution by the control circuitries 170. An application is a group of instructions, that, when executed by a processor, generates content for presentation to the user. Examples of applications include: gaming applications, conferencing applications, video playback applications, or other suitable applications.

Tracking module 174 calibrates system 100 using one or more calibration parameters and may adjust one or more calibration parameters to reduce error in determination of the position of the near-eye display 100.

Tracking module 174 tracks movements of near-eye display 100 using slow calibration information from the imaging device 160. Tracking module 174 also determines positions of a reference point of near-eye display 100 using position information from the fast calibration information.

Engine 176 executes applications within system 100 and receives position information, acceleration information, velocity information, and/or predicted future positions of near-eye display 100 from tracking module 174. In some embodiments, information received by engine 176 may be used for producing a signal (e.g., display instructions) to waveguide display assembly 110 that determines a type of content presented to the user. For example, to provide an interactive experience, engine 176 may determine the content to be presented to the user based on a location of the user (e.g., provided by tracking module 174), or a gaze point of the user (e.g., based on image data provided by imaging device 160), a distance between an object and user (e.g., based on image data provided by imaging device 160).

Figure 2A:
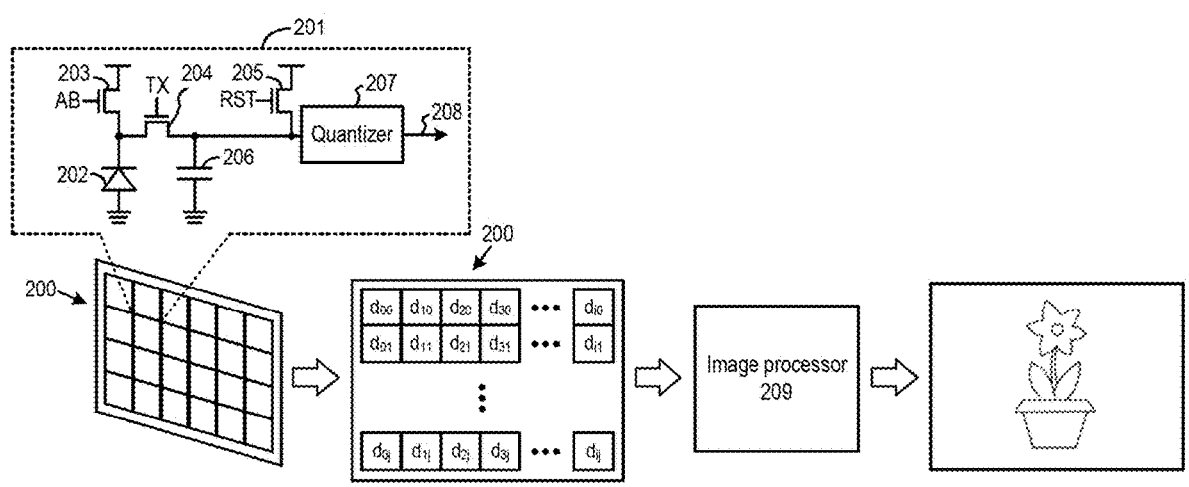
FIG. 2A, FIG. 2B, FIG. 2C, FIG. 2D, FIG. 2E, and FIG. 2F illustrate examples of an image sensor and its operations.
Figure 2B:
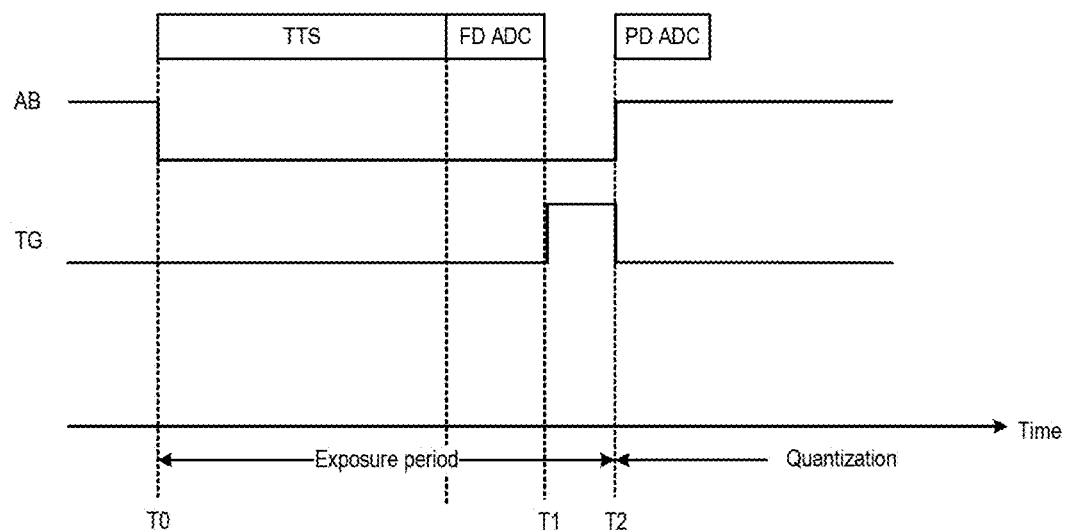

FIG. 2A, FIG. 2B, FIG. 2C, FIG. 2D, FIG. 2E, and FIG. 2F illustrate examples of an image sensor 200 (i.e., a digital image sensor) and its operations. As shown in FIG. 2A, image sensor 200 can include an array of pixel cells, including pixel cell 201, and can generate digital intensity data corresponding to pixels of an image. Pixel cell 201 may be part of an array of pixel cells in an image sensor 200. As shown in FIG. 2A, pixel cell 201 may include one or more photodiodes 202, an electronic shutter switch 203, a transfer switch 204, a reset switch 205, a charge storage device 206, and a quantizer 207. Quantizer 207 can be a pixel-level ADC that is accessible only by pixel cell 201. Photodiode 202 may include, for example, a P-N diode, a P-I-N diode, or a pinned diode, whereas charge storage device 206 can be a floating diffusion node of transfer switch 204. Photodiode 202 can generate and accumulate charge upon receiving light within an exposure period, and the quantity of charge generated within the exposure period can be proportional to the intensity of the light.

The exposure period can be defined based on the timing of AB signal controlling electronic shutter switch 203, which can steer the charge generated by photodiode 202 away when enabled, and based on the timing of the TX signal controlling transfer switch 204, which can transfer the charge generated by photodiode 202 to charge storage device 206 when enabled. For example, referring to FIG. 2B, the AB signal can be de-asserted at time T0 to allow photodiode 202 to generate charge and accumulate at least some of the charge as residual charge until photodiode 202 saturates. T0 can mark the start of the exposure period. The TX signal can set transfer switch 204 at a partially-on state to transfer additional charge (e.g., overflow charge) generated by photodiode 202 after saturation to charge storage device 206. At time T1, the TG signal can be asserted to transfer the residual charge to charge storage device 206, so that charge storage device 206 can store all of the charge generated by photodiode 202 since the beginning of the exposure period at time T0.

At the time T2, the TX signal can be de-asserted to isolate charge storage device 206 from photodiode 202, whereas the AB signal can be asserted to steer charge generated by photodiode 202 away. The time T2 can mark the end of the exposure period. An analog voltage across charge storage device 206 at time T2 can represent the total quantity of charge stored in charge storage device 206, which can correspond to the total quantity of charge generated by photodiode 202 within the exposure period. Both TX and AB signals can be generated by a controller (not shown in FIG. 2A) which can be part of pixel cell 201. After the analog voltage is quantized, reset switch 205 can be enabled by an RST signal to remove the charge in charge storage device 206 to prepare for the next measurement.

Figure 2C:
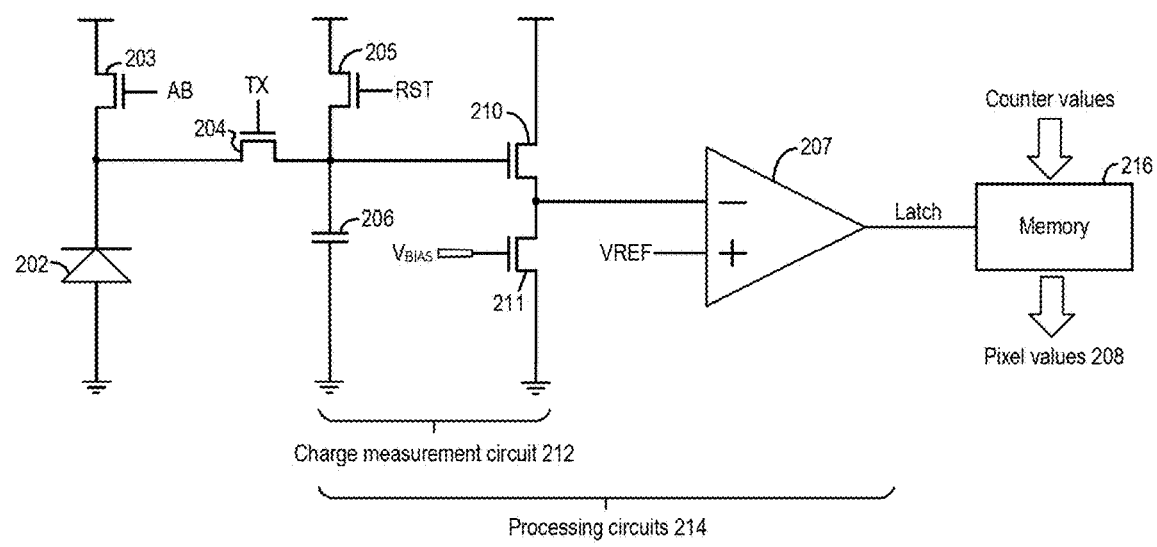

FIG. 2C illustrates additional components of pixel cell 201. As shown in FIG. 2C, pixel cell 201 can include a source follower 210 that can buffer the voltage at charge storage device 206, and output the voltage to quantizer 207. Charge storage device 206 and source follower 210 can form a charge measurement circuit 212. Source follower 210 can include a current source 211 controlled by a bias voltage $V_{BIAS}$, which sets the current that flows through source follower 210. Quantizer 207 can include a comparator. Charge measurement circuit 212 and quantizer 207 together can form a processing circuits 214. The comparator is further coupled with a memory 216 to store a quantization output as pixel value 208. Memory 216 can include a bank of memory devices, such as static random-access memory (SRAM) devices, with each memory device configured as a bit cell. The number of memory devices in the bank can be based on a resolution of the quantization output. For example, if the quantization output has a 10-bit resolution, memory 216 can include a bank of ten SRAM bit cells. In a case where pixel cell 201 includes multiple photodiodes to detect light of different wavelength channels, memory 216 may include multiple banks of SRAM bit cells.

Figure 2D:
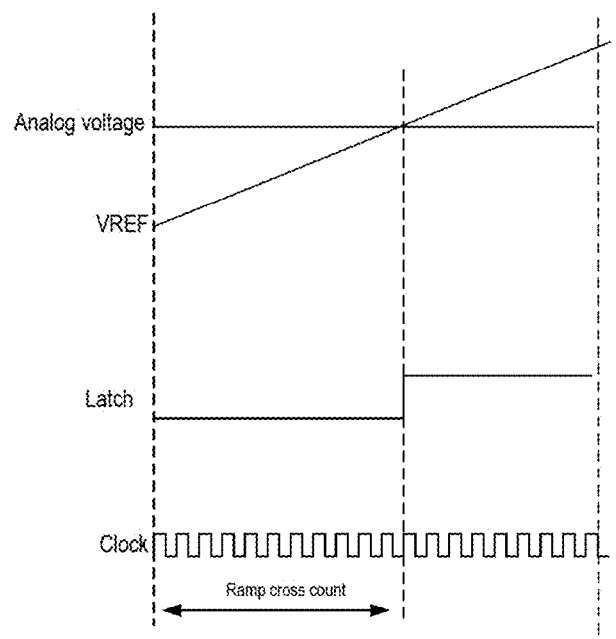

Quantizer 207 can be controlled by the controller to quantize the analog voltage after time T2 to generate a pixel value 208. FIG. 2D illustrates an example quantization operation performed by quantizer 207. As shown in FIG. 2D, quantizer 207 can compare the analog voltage output by source follower 210 with a ramping reference voltage (labelled "VREF" in FIG. 2C and FIG. 2D) to generate a comparison decision (labelled "Latch" in FIG. 2C and FIG. 2D). The time it takes for the decision to trip can be measured by a counter to represent a result of quantization of the analog voltage. In some examples, the time can be measured by a free-running counter that starts counting when the ramping reference voltage is at the start point. The free-running counter can periodically updates its count value based on a clock signal (labelled "clock" in FIG. 2D) and as the ramping reference voltage ramps up (or down). The comparator output trips when the ramping reference voltage meets the analog voltage. The tripping of the comparator output can cause a count value to be stored in memory 216. The count value can represent a quantization output of the analog voltage. Referring back to FIG. 2C, the count value stored in memory 216 can be read out as pixel value 208.

In FIG. 2A and FIG. 2C, pixel cell 201 is illustrated as including processing circuits 214 (including charge measurement circuit 212 and quantizer 207) and memory 216. In some examples, processing circuits 214 and memory 216 can be external to pixel cell 201. For example, a block of pixel cells can share and take turn in accessing processing circuits 214 and memory 216 to quantize the charge generated by the photodiode(s) of each pixel cell and to store the quantization result.

Figure 2E:
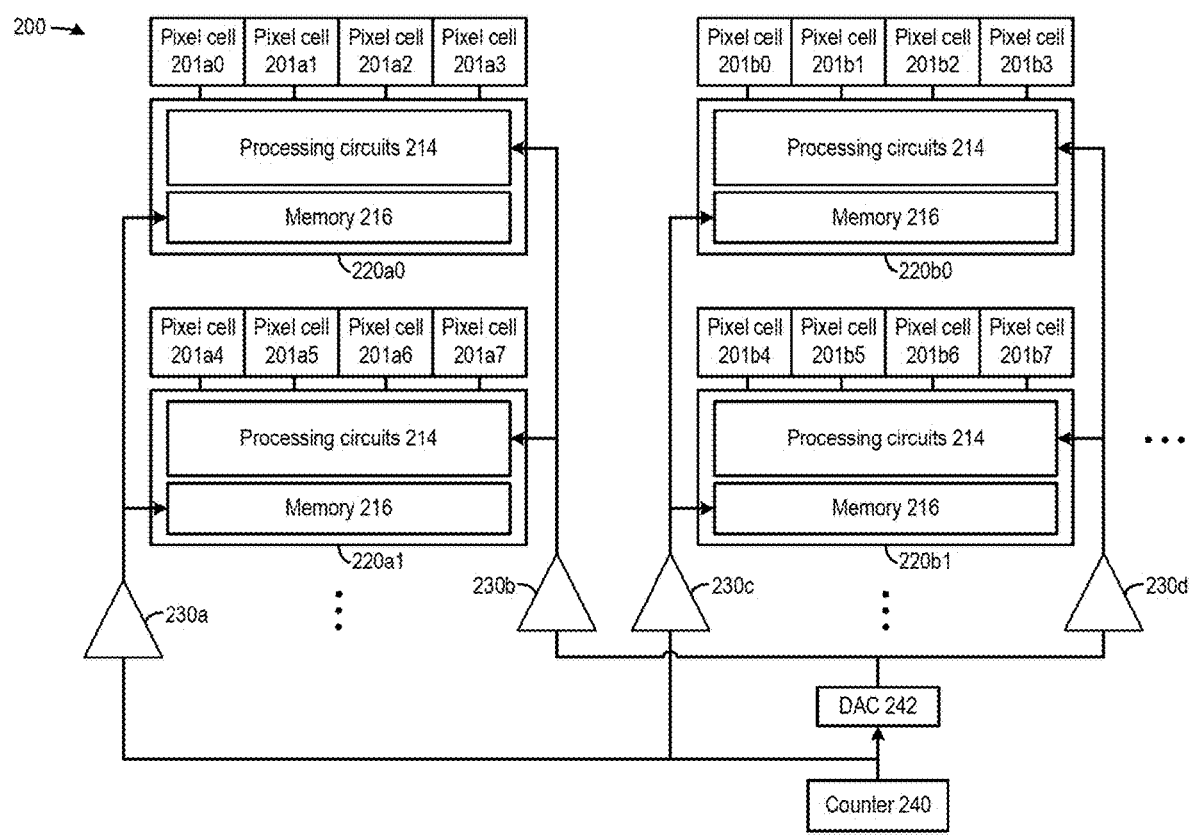

FIG. 2E illustrates additional components of image sensor 200. As shown in FIG. 2E, image sensor 200 includes pixel cells 201 arranged in rows and columns, such as pixel cells 201a0-a3, 201a4-a7, 201b0-b3, or 201b4-b7. Each pixel cell may include one or more photodiodes 202. Image sensor 200 further includes quantization circuits 220 (e.g., quantization circuit 220a0, a1, b0, b1) comprising processing circuits 214 (e.g., charge measurement circuit 212 and comparator/quantizer 207) and memory 216. In the example of FIG. 2E, a block of four pixel cells may share a block-level quantization circuit 220, which can include a block-level ADC (e.g., comparator/quantizer 207) and a block-level memory 216 via a multiplexor (not shown in FIG. 2E), where each pixel cell takes turn in accessing quantization circuit 220 to quantize the charge. For example, pixel cells 201a0-a3 share quantization circuit 220a0, pixel cells 201a4-a7 share quantization circuit 221a1, pixel cells 201b0-b3 share quantization circuit 220b0, whereas pixel cells 201b4-b7 share quantization circuit 220b1. In some examples, each pixel cell may include or has its dedicated quantization circuit.

In addition, image sensor 200 further includes other circuits, such as a counter 240 and a digital-to-analog converter (DAC) 242. Counter 240 can be configured as a digital ramp circuit to supply count values to memory 216. The count values can also be supplied to DAC 242 to generate an analog ramp, such as VREF of FIG. 2C and FIG. 2D, which can be supplied to quantizer 207 to perform the quantization operation. Image sensor 200 further includes a buffer network 230 including buffers 230a, 230b, 230c, 230d, etc. to distribute the digital ramp signals representing the counter values, and the analog ramp signal, to processing circuits 214 of different blocks of pixel cells, such that at any given time each processing circuit 214 receives the same analog ramp voltage and the same digital ramp counter value. This is to ensure that any difference in the digital values output by different pixel cells is due to differences in the intensity of light received by the pixel cells, not due to mismatches in the digital ramp signals/counter values and analog ramp signals received by the pixel cells.

Figure 2F:
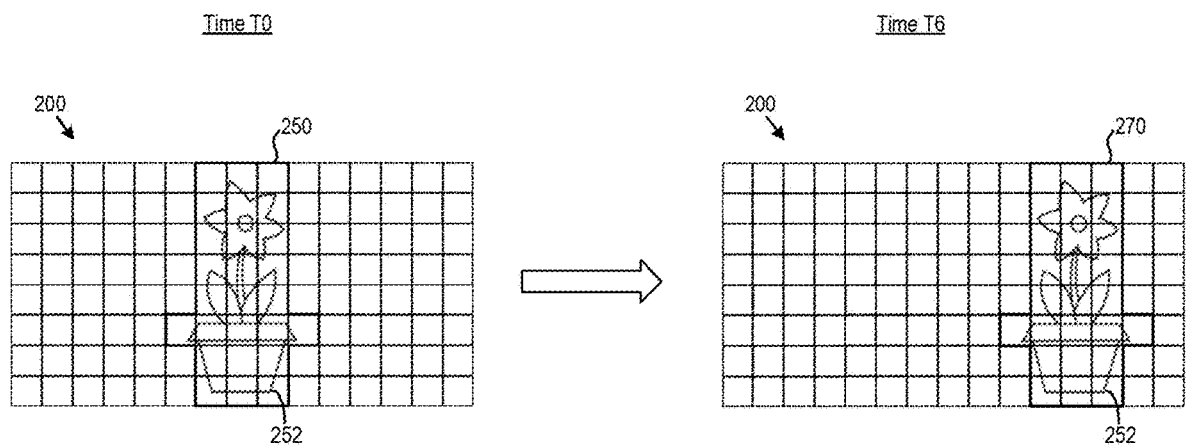

The image data from image sensor 200 can be transmitted to host processor (not shown in FIG. 2A-FIG. 2E) to support different applications, such as identifying and tracking object 252 or performing depth sensing of object 252 with respect to image sensor 200 depicted in FIG. 2F. For all these applications, only a subset of pixel cells provide relevant information (e.g., pixel data of object 252), whereas the rest of pixel cells do not provide relevant information. For example, referring to FIG. 2F, at time T0 a group of pixel cells 250 of image sensor 200 receive light reflected by object 252, whereas time T6, object 252 may have shifted (e.g., due to a movement of object 252, a movement of image sensor 200, or both), and a group of pixel cells 270 of image sensor 200 receive light reflected by object 252. At both times T0 and T6, image sensor 200 can transmit only the pixel data from group of pixel cells 260 and 270, as a sparse image frame, to the host processor to reduce the volume of pixel data being transmitted. Such arrangements can allow transmission of higher resolution images at a higher frame rate. For example, a larger pixel cell array including more pixel cells can be used to image object 252 to improve image resolution, while the bandwidth and power required to provide the improved image resolution can be reduced when only a subset of the pixel cells, including the pixel cells that provide pixel data of object 252, transmit the pixel data to the host processor. Similarly, image sensor 200 can be operated to generate images at a higher frame rate, but the increases in bandwidth and power can be reduced when each image only includes pixel values output by the subset of the pixel cells. Similar techniques can be employed by image sensor 200 in the case of 3D sensing.

The volume of pixel data transmission can also be reduced in the case of 3D sensing. For example an illuminator can project a pattern of structured light onto an object. The structured light can be reflected on a surface of an object and a pattern of reflected light can be captured by image sensor 200 to generate an image. Host processors can match pattern with object pattern and determine the depth of objects with respect to image sensor 200 based on the configuration of object pattern in the image. For 3D sensing, only groups of pixel cells contain relevant information (e.g., pixel data of pattern 252). To reduce the volume of pixel data being transmitted, image sensor 200 can be configured to send only the pixel data from groups of pixel cells or the image location locations of patterns in the image, to the host processor.

Figure 3:
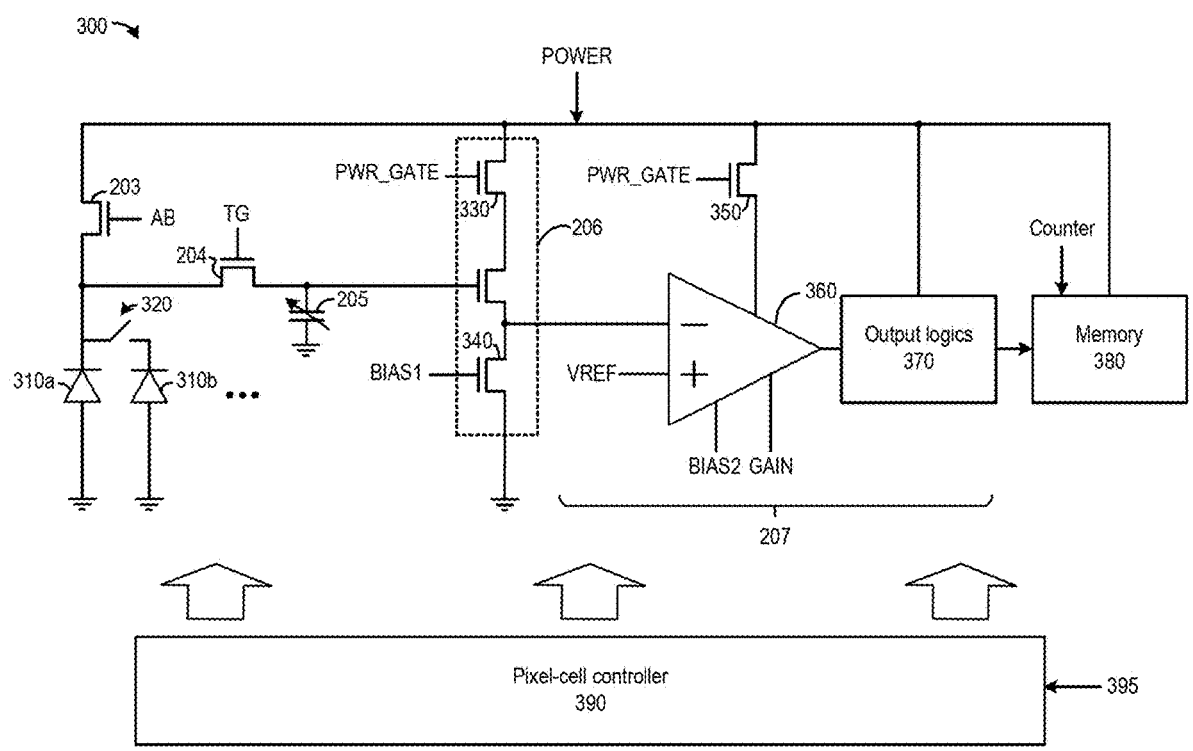
FIG. 3 illustrates example internal components of a pixel cell of a pixel array.

FIG. 3 illustrates example internal components of a pixel cell 300 of a pixel cell array, which can include at least some of the components of pixel cell 201 of FIG. 2A. Pixel cell 300 can include one or more photodiodes, including photodiodes 310a, 310b, etc., each can be configured to detect light of a different frequency range. For example, photodiode 310a can detect visible light (e.g., monochrome, or one of red, green, or blue color), whereas photodiode 310b can detect infra light. Pixel cell 300 further includes a switch 320 (e.g., a transistor, a controller barrier layer) to control which photodiode outputs charge for pixel data generation.

In addition, pixel cell 300 further includes electronic shutter switch 203, transfer switch 204, charge storage device 205, buffer 206, quantizer 207 as shown in FIG. 2A, as well as a memory 380. Charge storage device 205 can have a configurable capacitance to set a charge-to-voltage conversion gain. In some examples, the capacitance of charge storage device 205 can be increased to store overflow charge for FD ADC operation for a medium light intensity to reduce the likelihood of charge storage device 205 being saturated by the overflow charge. The capacitance of charge storage device 205 can also be decreased to increase the charge-to-voltage conversion gain for PD ADC operation for a low light intensity. The increase in the charge-to-voltage conversion gain can reduce quantization error and increase the quantization resolution. In some examples, the capacitance of charge storage device 205 can also be decreased during the FD ADC operation to increase the quantization resolution. Buffer 206 includes a current source 340 of which the current can be set by a bias signal BIAS1, as well as a power gate 330 which can be controlled by a PWR_GATE signal to turn on/off buffer 206. Buffer 206 can be turned off as part of disabling pixel cell 300.

In addition, quantizer 207 includes a comparator 360 and output logics 370. Comparator 207 can compare the output of buffer with a reference voltage (VREF) to generate an output. Depending on a quantization operation (e.g., TTS, FD ADC, and PD ADC operations), comparator 360 can compare the buffered voltage with different VREF voltages to generate the output, and the output be further processed by output logics 370 to cause memory 380 to store a value from a free running counter as the pixel output. The bias current of comparator 360 can be controlled by a bias signal BIAS2 which can set the bandwidth of comparator 360, which can be set based on the frame rate to be supported by pixel cell 300. Moreover, the gain of comparator 360 can be controlled by a gain control signal GAIN. The gain of comparator 360 can be set based on a quantization resolution to be supported by pixel cell 300. Comparator 360 further includes a power switch 350 which can also be controlled by the PWR_GATE signal to turn on/off comparator 360. Comparator 360 can be turned off as part of disabling pixel cell 300.

In addition, output logics 370 can select the outputs of one of the TTS, FD ADC, or PD ADC operations and based on the selection, determine whether to forward the output of comparator 360 to memory 380 to store the value from the counter. Output logics 370 can include internal memory to store indications, based on the output of comparator 360, of whether the photodiode 310 (e.g., photodiode 310a) is saturated by the residual charge, and whether charge storage device 205 is saturated by the overflow charge. If charge storage device 205 is saturated by the overflow charge, output logics 370 can select TTS output to be stored in memory 380 and prevent memory 380 from overwriting the TTS output by the FD ADC/PD ADC output. If charge storage device 205 is not saturated but the photodiodes 310 are saturated, output logics 370 can select the FD ADC output to be stored in memory 380; otherwise output logics 370 can select the PD ADC output to be stored in memory 380. In some examples, instead of the counter values, the indications of whether photodiodes 310 are saturated by the residual charge and whether charge storage device 205 is saturated by the overflow charge can be stored in memory 380 to provide the lowest precision pixel data.

In addition, pixel cell 300 may include a pixel-cell controller 390, which can include logic circuits to generate control signals such as AB, TG, BIAS1, BIAS2, GAIN, VREF, PWR_GATE, etc. Pixel-cell controller 390 can also be programmed by pixel-level programming signals 395. For example, to disable pixel cell 300, pixel-cell controller 390 can be programmed by pixel-level programming signals 395 to de-assert PWR_GATE to turn off buffer 206 and comparator 360. Moreover, to increase the quantization resolution, pixel-cell controller 390 can be programmed by pixel-level programming signals 395 to reduce the capacitance of charge storage device 205, to increase the gain of comparator 360 via GAIN signal, etc. To increase the frame rate, pixel-cell controller 390 can be programmed by pixel-level programming signals 395 to increase BIAS1 signal and BIAS2 signal to increase the bandwidth of, respectively, buffer 206 and comparator 360. Further, to control the precision of pixel data output by pixel cell 300, pixel-cell controller 390 can be programmed by pixel-level programming signals 395 to, for example, connect only a subset of bits (e.g., most significant bits) of the counter to memory 380 so that memory 380 only stores the subset of bits, or to store the indications stored in output logics 370 to memory 380 as the pixel data. In addition, pixel-cell controller 390 can be programmed by pixel-level programming signals 395 to control the sequence and timing of AB and TG signals to, for example, adjust the exposure period and/or select a particular quantization operation (e.g., one of TTS, FD ADC, or PD ADC) while skipping the others based on the operation condition, as described above.

Figure 4A:
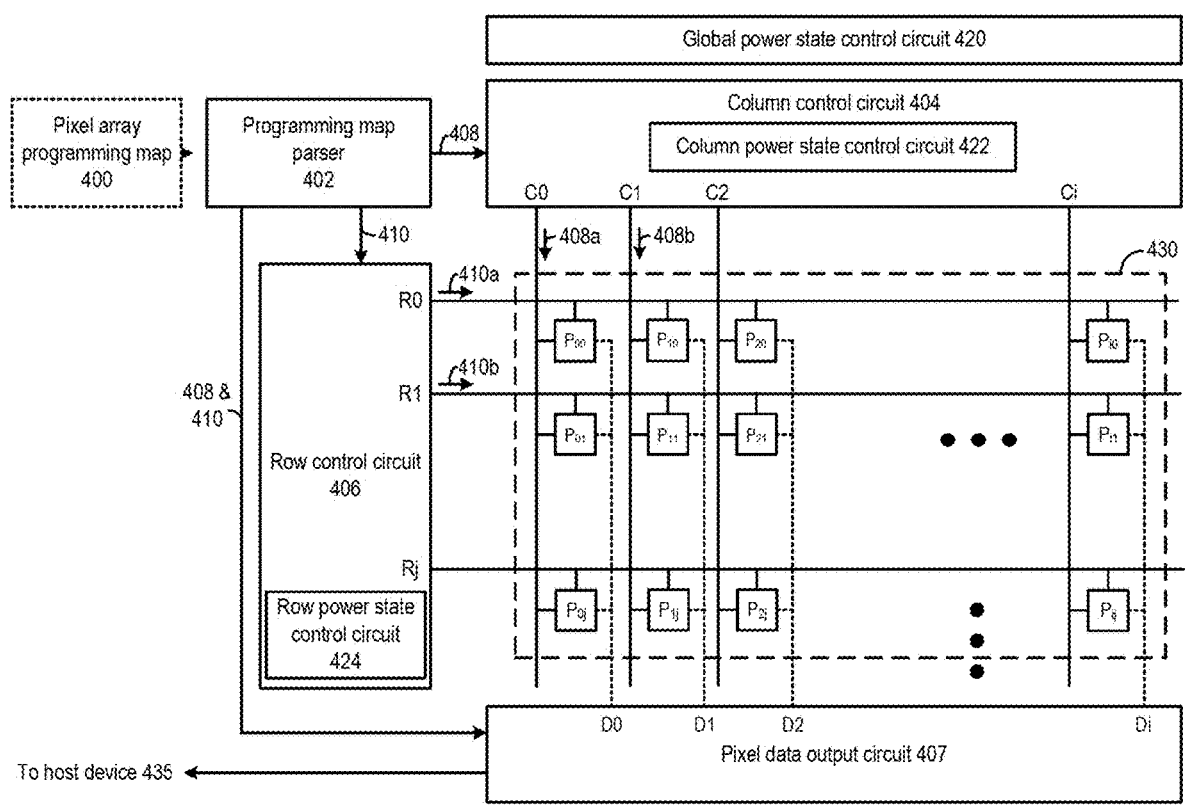
FIG. 4A, FIG. 4B, and FIG. 4C illustrate example components of a peripheral circuit and pixel cell array of an image sensor.
Figure 4B:
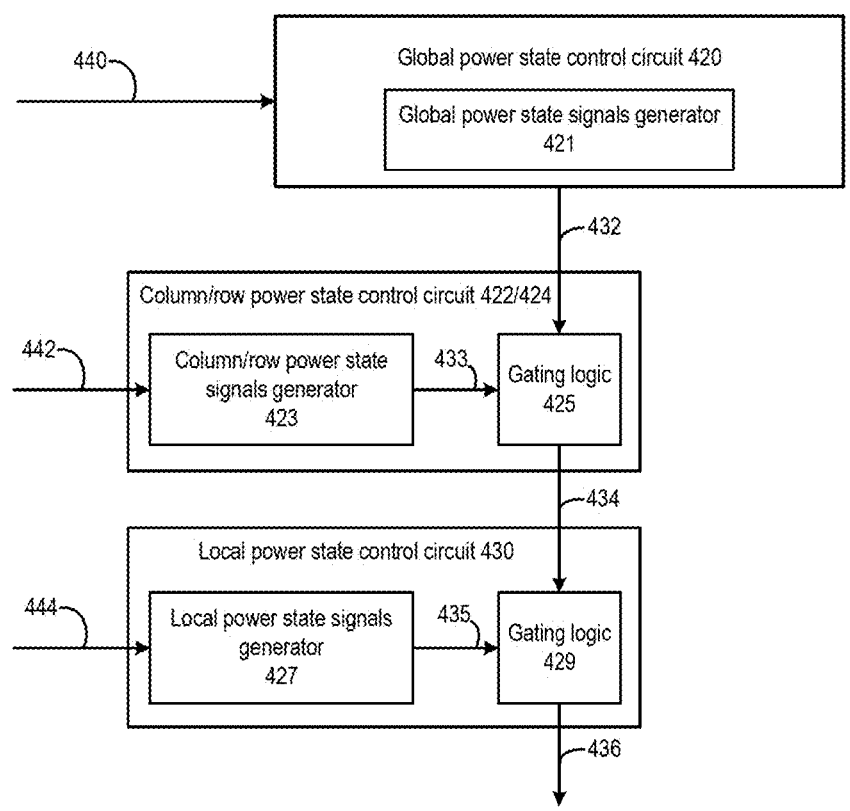
Figure 4C:
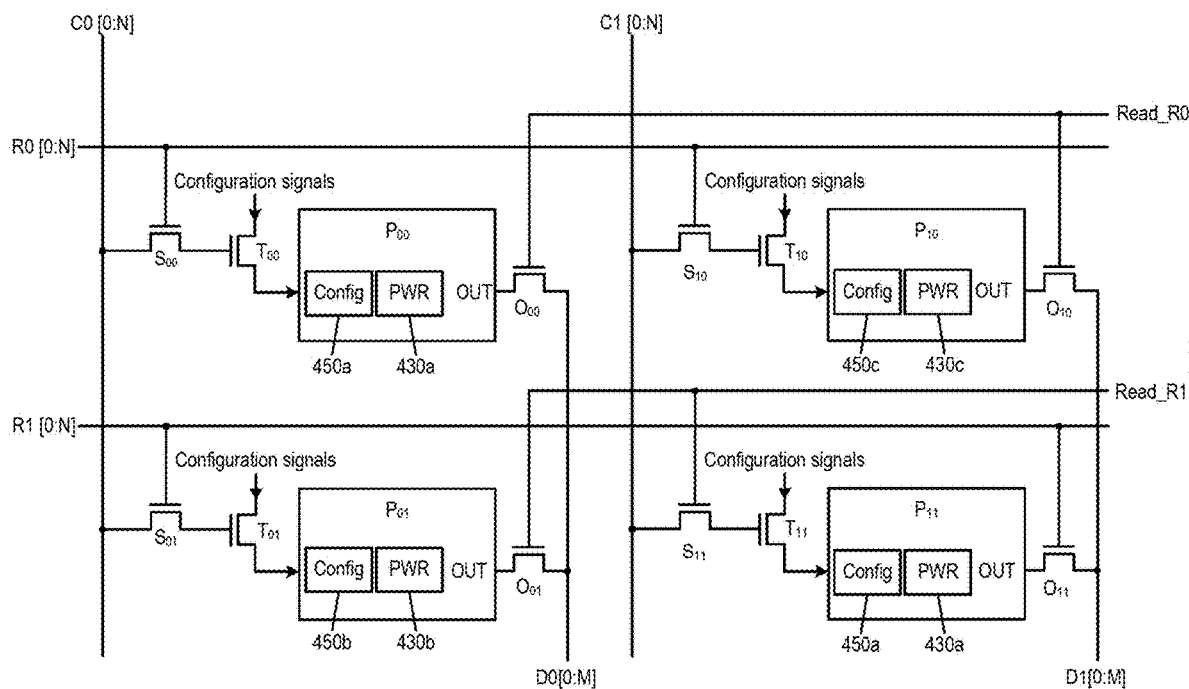

FIG. 4A, FIG. 4B, and FIG. 4C illustrate example components of a peripheral circuit and pixel cell array of an image sensor, such as image sensor 200. As shown in FIG. 4A, an image sensor can include a programming map parser 402, a column control circuit 404, a row control circuit 406, and a pixel data output circuit 407. Programming map parser 402 can parse pixel array programming map 400, which can be in a serial data stream, to identify the programming data for each pixel cell (or block of pixel cells). The identification of the programming data can be based on, for example, a pre-determined scanning pattern by which the two-dimensional pixel array programming map is converted into the serial format, as well as the order by which the programming data is received by programming map parser 402 from the serial data stream. Programming map parser 402 can create a mapping among the row addresses of the pixel cells, the column addresses of the pixel cells, and one or more configuration signals based on the programming data targeted at the pixel cells. Based on the mapping, programming map parser 402 can transmit control signals 408 including the column addresses and the configuration signals to column control circuit 404, as well as control signals 410 including the row addresses mapped to the column addresses and the configuration signals to row control circuit 406. In some examples, the configuration signals can also be split between control signals 408 and control signals 410, or sent as part of control signals 410 to row control circuit 406.

Column control circuit 404 and row control circuit 406 are configured to forward the configuration signals received from programming map parser 402 to the configuration memory of each pixel cell of pixel cell array 318. In FIG. 4A, each box labelled $P_{ij}$ (e.g., $P_{00}$, $P_{01}$, $P_{10}$, $P_{11}$) can represent a pixel cell or a block of pixel cells (e.g., a 2×2 array of pixel cells, a 4×4 array of pixel cells) and can include or can be associated with a quantization circuit 220 of FIG. 2E comprising processing circuits 214 and memory 216. As shown in FIG. 4A, column control circuit 404 drives a plurality of sets of column buses C0, C1, . . . Ci. Each set of column buses includes one or more buses and can be used to transmit control signals, which can include a column selection signal and/or other configuration signals, to a column of pixel cells. For example, column bus(es) C0 can transmit a column selection signal 408a to select a column of pixel cells (or a column of blocks of pixel cells) $p_{00}$, $p_{01}$, . . . $p_{0j}$, column bus(es) C1 can transmit a column selection signal 408b to select a column of pixel cells (or blocks of pixel cells) $p_{10}$, $p_{11}$, . . . $p_{1j}$, etc.

Further, row control circuit 406 drives a plurality of sets of row buses labelled R0, R1, . . . Rj. Each set of row buses also includes one or more buses and can be used to transmit control signals, which can include a row selection signal and/or other configuration signals, to a row of pixel cells, or a row of blocks of pixel cells. For example, row bus(es) R0 can transmit a row selection signal 410a to select a row of pixel cells (or blocks of pixel cells) $p_{00}, p_{10}, \ldots p_{i0}$, row bus(es) R1 can transmit a row selection signal 410b to select a row of pixel cells (or blocks of pixel cells) $p_{01}, p_{11}, \ldots p_{1i}$, etc. Any pixel cell (or block of pixel cells) within pixel cell array 318 can be selected based on a combination of the row selection signal and the column signal to receive the configuration signals. The row selection signals, column selection signals, and the configuration signals (if any) are synchronized based on control signals 408 and 410 from programming map parser 402, as described above. Each column of pixel cells can share a set of output buses to transmit pixel data to pixel data output circuit 407. For example, column of pixel cells (or blocks of pixel cells) $p_{00}, p_{01}, \ldots p_{0j}$ can share output buses $D_0$, column of pixel cells (or blocks of pixel cells) $p_{10}, p_{11}, \ldots p_{1j}$ can share output buses $D_1$, etc.

Pixel data output circuit 407 can receive the pixel data from the buses, convert the pixel data into one or more serial data streams (e.g., using a shift register), and transmit the data streams to host device 435 under a pre-determined protocol such as MIPI. The data stream can come from a quantization circuit 220 (e.g., processing circuits 214 and memory 216) associated with each pixel cell (or block of pixel cells) as part of a sparse image frame. In addition, pixel data output circuit 407 can also receive control signals 408 and 410 from programming map parser 402 to determine, for example, which pixel cell does not output pixel data or the bit width of pixel data output by each pixel cell, and then adjust the generation of serial data streams accordingly. For example, pixel data output circuit 407 can control the shift register to skip a number of bits in generating the serial data streams to account for, for example, variable bit widths of output pixel data among the pixel cells or the disabling of pixel data output at certain pixel cells.

In addition, a pixel cell array control circuit further includes a global power state control circuit, such as global power state control circuit 420, a column power state control circuit 422, a row power state control circuit 424, and a local power state control circuit 430 at each pixel cell or each block of pixel cells (not shown in FIG. 4A) forming hierarchical power state control circuits. Global power state control circuit 420 can be of the highest level in the hierarchy, followed by row/column power state control circuit 422/424, with a local power state control circuit 430 at the lowest level in the hierarchy.

The hierarchical power state control circuits can provide different granularities in controlling the power state of an image sensor, such as image sensor 200. For example, global power state control circuit 420 can control a global power state of all circuits of image sensor, including processing circuits 214 and memory 216 of all pixel cells, DAC 242 and counter 240 of FIG. 2E, etc. Row power state control circuit 424 can control the power state of processing circuits 214 and memory 216 of each row of pixel cells (or blocks of pixel cells) separately, whereas column power state control circuit 422 can control the power state of processing circuits 214 and memory 216 of each column of pixel cells (or blocks of pixel cells) separately. Some examples may include row power state control circuit 424 but not column power state control circuit 422, or vice versa. In addition, a local power state control circuit 430 can be part of a pixel cell or a block of pixel cells, and can control the power state of processing circuits 214 and memory 216 of the pixel cell or the block of pixel cells.

FIG. 4B illustrates examples of internal components of hierarchical power state control circuits and their operations. Specifically, global power state control circuit 420 can output a global power state signal 432, which can be in the form of a bias voltage, a bias current, a supply voltage, or programming data, that sets a global power state of the image sensor. Moreover, column power state control circuit 422 (or row power state control circuit 424) can output a column/row power state signal 434 that sets a power state of a column/row of pixel cells (or blocks of pixel cells) of the image sensor. Column/row power state signal 434 can be transmitted as row signals 410 and column signals 408 to the pixel cells. Further, local power state control circuit 430 can output a local power state signal 436 that sets a power state of the pixel cell (or a block of pixel cells), including the associated processing circuits 214 and memory 216. Local power state signal 436 can be output to processing circuits 214 and memory 216 of the pixel cells to control their power state.

In hierarchical power state control circuits, an upper-level power state signal can set an upper bound for a lower-level power state signal. For example, global power state signal 432 can be an upper level power state signal for column/row power state signal 434 and set an upper bound for column/row power state signal 434. Moreover, column/row power state signal 434 can be an upper level power state signal for local power state signal 436 and set an upper bound for local power state signal 436. For example, if global power state signal 432 indicates a low power state, column/row power state signal 434 and local power state signal 436 may also indicate a low power state.

Each of global power state control circuit 420, column/row power state control circuit 422/424, and local power state control circuit 430 can include a power state signal generator, whereas column/row power state control circuit 422/424, and local power state control circuit 430 can include a gating logic to enforce the upper bound imposed by an upper-level power state signal. Specifically, global power state control circuit 420 can include a global power state signals generator 421 to generate global power state signal 432. Global power state signals generator 421 can generate global power state signal 432 based on, for example, an external configuration signal 440 (e.g., from a host device) or a pre-determined temporal sequences of global power states.

In addition, column/row power state control circuit 422/424 can include a column/row power state signals generator 423 and a gating logic 425. Column/row power state signals generator 423 can generate an intermediate an column/row power state signal 433 based on, for example, an external configuration signal 442 (e.g., from a host device) or a predetermined temporal sequences of row/column power states. Gating logic 425 can select one of global power state signal 432 or intermediate column/row power state signal 433 representing the lower power state as column/row power state signal 434.

Further, local power state control circuit 430 can include a local power state signals generator 427 and a gating logic 429. Low power state signals generator 427 an intermediate local power state signal 435 based on, for example, an external configuration signal 444, which can be from a pixel array programming map, a pre-determined temporal sequences of row/column power states, etc. Gating logic 429 can select one of intermediate local power state signal 435 or column/row power state signal 434 representing the lower power state as local power state signal 436.

FIG. 4C illustrates additional details of a pixel cell array, including local power state control circuit 430 (e.g., 430a, 430b, 430c, and 430d, labelled as "PWR" in FIG. 4C) and configuration memory 450 (e.g., 450a, 450b, 450c, and 450d, labelled as "Config" in FIG. 4C) of each pixel cell (or each block of pixel cells). Configuration memory 450 can store first programming data to control a light measurement operation (e.g., exposure period duration, quantization resolution) of a pixel cell (or a block of pixel cells). In addition, configuration memory 450 can also store second programming data that can be used by local power state control circuit 430 to set the power states of processing circuits 214 and memory 216. Configuration memory 450 can be implemented as a static random-access memory (SRAM). Although FIG. 4C shows that local power state control circuit 430 and configuration memory 450 are internal to each pixel cell, it is understood that configuration memory 450 can also be external to each pixel cell, such as when local power state control circuit 430 and configuration memory 450 are for a block of pixel cells.

As shown in FIG. 4C, the configuration memory 450 of each pixel cell is coupled with column buses C and row buses R via transistors S, such as $S_{00}$, $S_{10}$, $S_{10}$, $S_{11}$, etc. In some examples, each set of column buses (e.g., C0, C1) and row buses (e.g., R0, R1) can include multiple bits. For example, in FIG. 4C, each set of column buses and row buses can carry N+1 bits. It is understood that in some examples each set of column buses and row buses can also carry a single data bit. Each pixel cell is also electrically connected with transistors T, such as $T_{00}$, $T_{10}$, $T_{10}$, or $T_{11}$, to control the transmission of configuration signals to the pixel cell (or block of pixel cells). Transistor(s) S of each pixel cell can be driven by the row and column select signals to enable (or disable) the corresponding transistors T to transmit configuration signals to the pixel cell. In some examples, column control circuit 404 and row control circuit 406 can be programmed by a single write instruction (e.g., from a host device) to write to configuration memory 450 of multiple pixel cells simultaneously. Column control circuit 404 and row control circuit 406 can then control the row buses and column buses to write to the configuration memory of the pixel cells.

In some examples, local power state control circuit 430 can also receive configuration signal directly from transistors T without storing the configuration signals in configuration memory 450. For example, as described above, local power state control circuit 430 can receive row/column power state signal 434, which can be an analog signal such as a voltage bias signal or a supply voltage, to control the power state of the pixel cell and the processing circuits and/or memory used by the pixel cell.

In addition, each pixel cell also includes transistors O, such as $O_{00}$, $O_{10}$, $O_{10}$, or $O_{11}$, to control the sharing of the output bus D among a column of pixel cells. The transistors O of each row can be controlled by a read signal (e.g., read_R0, read_R1) to enable a row-by-row read out of the pixel data, such that one row of pixel cells output pixel data through output buses D0, D1, . . . Di, followed by the next row of pixel cells.

In some examples, the circuit components of a pixel cell array, including processing circuits 214 and memory 216, counter 240, DAC 242, buffer network including buffers 230, etc., can be organized into a hierarchical power domain managed by hierarchical power state control circuits. The hierarchical power domain may include a hierarchy of multiple power domains and power sub-domains. The hierarchical power state control circuits can individually set a power state of each power domain, and each power sub-domain under each power domain. Such arrangements allow fine grain control of the power consumption by image sensor 304 and support various spatial and temporal power state control operations to further improve the power efficiency of an image sensor.

While a sparse-image sensing operation can reduce the power and bandwidth requirement, having pixel-level ADCs (e.g., as shown in FIG. 6C) or block-level ADCs (e.g., as shown in FIG. 2E) to perform the quantization operations for the sparse-image sensing operation can still lead to inefficient use of power. Specifically, while some of the pixel-level or block-level ADCs are disabled, high speed control signals, such as clocks, analog ramp signals, or digital ramp signals, may still be transmitted to each pixel-level or block-level ADCs via buffer network 630, which can consume a substantial amount of power and increase the average power consumption for generation of each pixel. The inefficiency can be further exacerbated when the sparsity of the image frame increases (e.g., containing fewer pixels), but the high speed control signals are still transmitted to each pixel cell, such that the power consumption in transmitting the high speed control signals remains the same and the average power consumption for generation of each pixel increases due to fewer pixels being generated.

Figure 5:
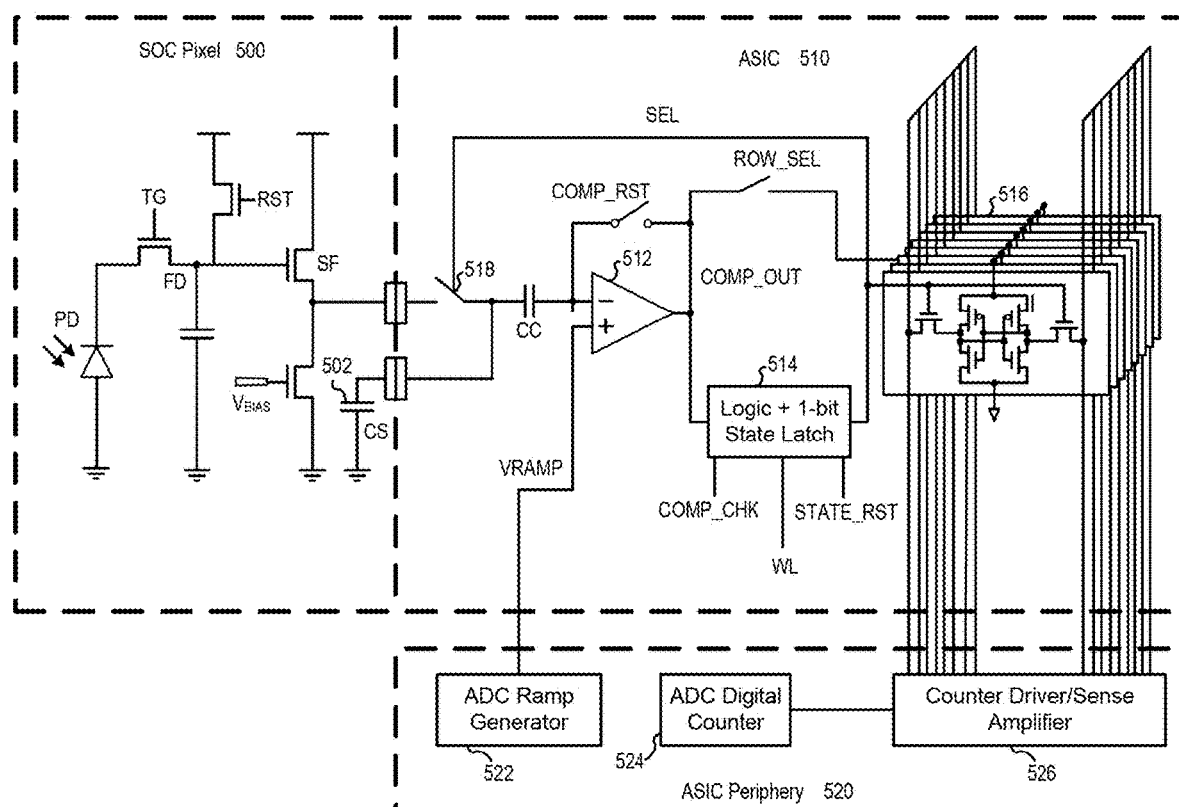
FIG. 5 illustrates an example of a pixel cell, integrated circuit, and periphery having reduced quantization operations.

FIG. 5 illustrates an example of a pixel cell, integrated circuit, and periphery having reduced quantization operations. Specifically, FIG. 5 depicts an example of digital image sensor apparatus for performing the embodiments described herein. SOC pixel 500 may be a pixel cell configured to generate a charge in a photodiode, similar to pixel cell 201 depicted in FIG. 2A and FIG. 2C. For example, SOC pixel 500 includes components of the pixel cell 201 such as components 201-206 and others.

SOC pixel 500 further includes sampling capacitor 502. Sampling capacitor 502 may be a capacitor or other charge storage device capable of converting a generated charge from a photodiode, such as photodiode 202 into an analog voltage signal. As depicted in FIG. 5, sampling capacitor 502 is coupled to the rest of SOC pixel 500 via switch 518 in the ASIC 510 layer. Thus, the sampling capacitor 502 is prevented from further generating a charge when switch 518 is in an open state and may begin or continue to generate a charge when switch 518 is in a closed state.

ASIC 510 further comprises comparator 512. Comparator 512 may be an operational amplifier-based comparator configured to compare analog voltage values. For example, as depicted in FIG. 5, comparator 512 may receive a signal from sampling capacitor 502 as one input. In various embodiments, the signal received from sampling capacitor 502 is modified by a second correlated capacitor (depicted in FIG. 5 as CC) as part of a correlated double sampling process to double the gain of the charge sharing operational amplifier. The operational amplifier may receive a threshold voltage value signal to compare against the captured voltage signal to determine if the charge stored by sampling capacitor 502 is sufficient to meet or surpass the threshold voltage value. For example, as depicted in FIG. 5, an ADC ramp generator 522 located in an ASIC periphery 520 of the digital image sensor may send a ramp signal (depicted in FIG. 5 as VRAMP) to the comparator 512 to perform the comparison. The output of the comparator may then be forwarded to another logical circuit.

State latch 514 is coupled to the output of comparator 512. State latch 514 may be a latch-based circuit within ASIC 510 configured to receive, as input, output from the comparator 512 and a COMP_CHK signal to determine if sufficient charge has been collected, and output a one bit state latch signal (depicted in FIG. 5 as SEL). The SEL signal is used to open the switch 518 when it is determined that the captured voltage signal of sampling capacitor 502 meets or exceeds the threshold voltage value received at the comparator 512. In some embodiments, state latch 514 is also configured to generate, facilitate and update a flag bit field corresponding to a time period in which the comparison between the captured voltage value and the threshold voltage value is performed. The state latch 514 may update this flag bit field at specific time periods throughout a frame capture period to track the time periods at which the sampling capacitor 502 is checked for sufficient charge for accurate quantization.

The output of comparator 512 and the output of state latch 514 are connected to a memory in the ASIC 510, such as memory 516. Memory 516 may be a memory embedded in the ASIC 510 for storing the pixel value based on the collected charge and the corresponding flag bit field value. Memory 516 may be, for example, a collection of static random access memory (SRAM) for facilitating the embodiments described herein. Memory 516 may receive the converted voltage value and the flag bit field from the comparator 512 and the state latch 514 and store those values for subsequent read-out operations.

As an example, the ROW_SEL signal depicted in FIG. 5 may act as a control signal for a switch that will toggle connection between the output of the comparator 512 and the memory 516. When the stored charge on the capacitor either reaches the threshold voltage, or the exposure period concludes, the SEL switch is opened, preventing any further accumulation of charge. At substantially the same time, the state latch stores the flag bit value in memory 516. Once the end of the exposure period arrives, the stored voltage is quantized and stored in the memory 516 so that it corresponds to the stored flag bit value. Thus, both the quantized pixel value and the flag bit value are captured and stored together.

Figure 6:
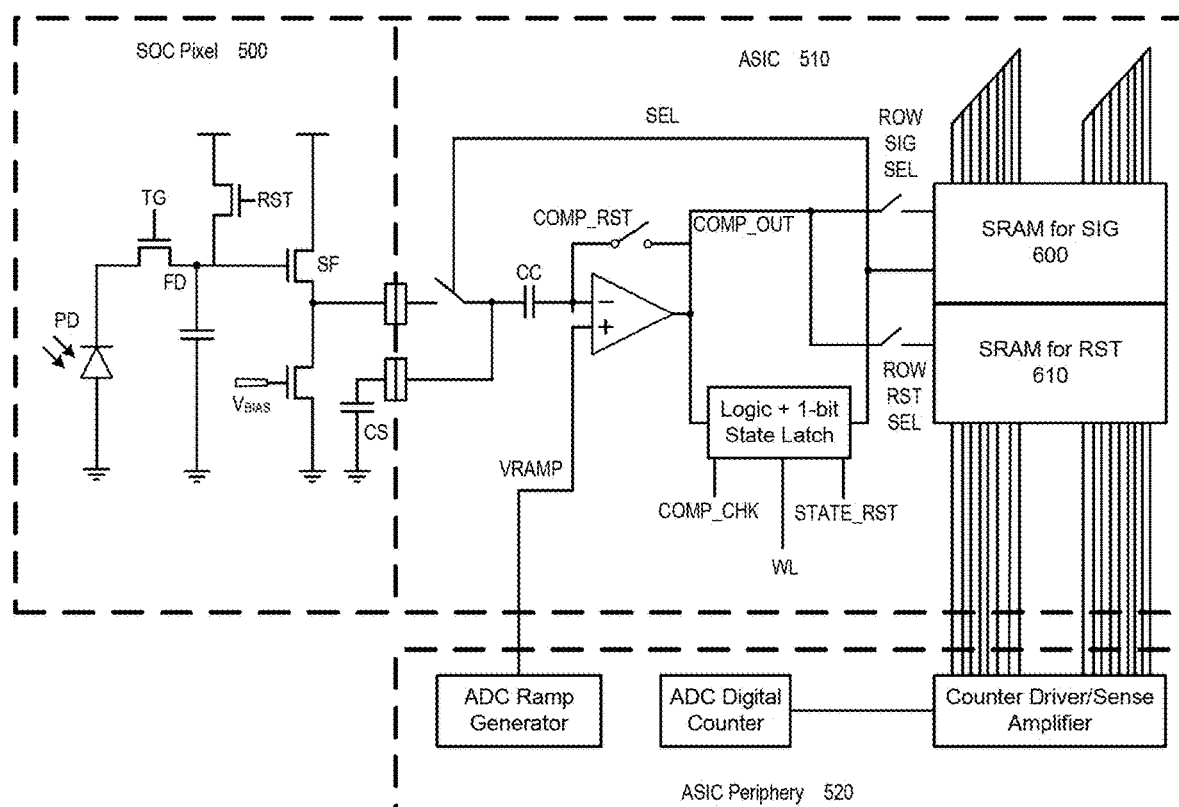
FIG. 6 illustrates an example of a pixel cell, integrated circuit, and periphery having reduced quantization operations, including static random-access memory.

FIG. 6 illustrates an example of a pixel cell, integrated circuit, and periphery having reduced quantization operations, including static random-access memory. Specifically, FIG. 6 illustrates a digital image sensor similar to the digital image sensor depicted in FIG. 5 and including a SRAM for signals and a SRAM for reset (RST) values as part of a digital correlated double sampling (CDS) operation implemented as parts of memory 516 depicted in FIG. 5. The digital CDS operation may remove pixel-to-pixel fixed pattern noise (FPN). As depicted in FIG. 6, a SRAM component for the RST is introduced to the digital image sensor of FIG. 5 to allow for digital CDS processing. This component is depicted in FIG. 6 as SRAM for RST 610. SRAM for RST 610 may exist in a memory depicted as SRAM for SIG 600. SRAM for SIG 600 is connected to the comparator 512 and state latch 514 as depicted in FIG. 5. SRAM for RST 610 may be further connected to the comparator via ROW_RST_SEL connection. The SRAM for RST 610 may pulse a signal for a period of time before the beginning of the first capture time period to capture a noise level for the pixel, which may be stored in the SRAM for RST 610. The noise values in this SRAM for RST 610 component may be used to digitally remove corresponding noise signals in the values stored in the SRAM for SIG 600 component.

Figure 7:
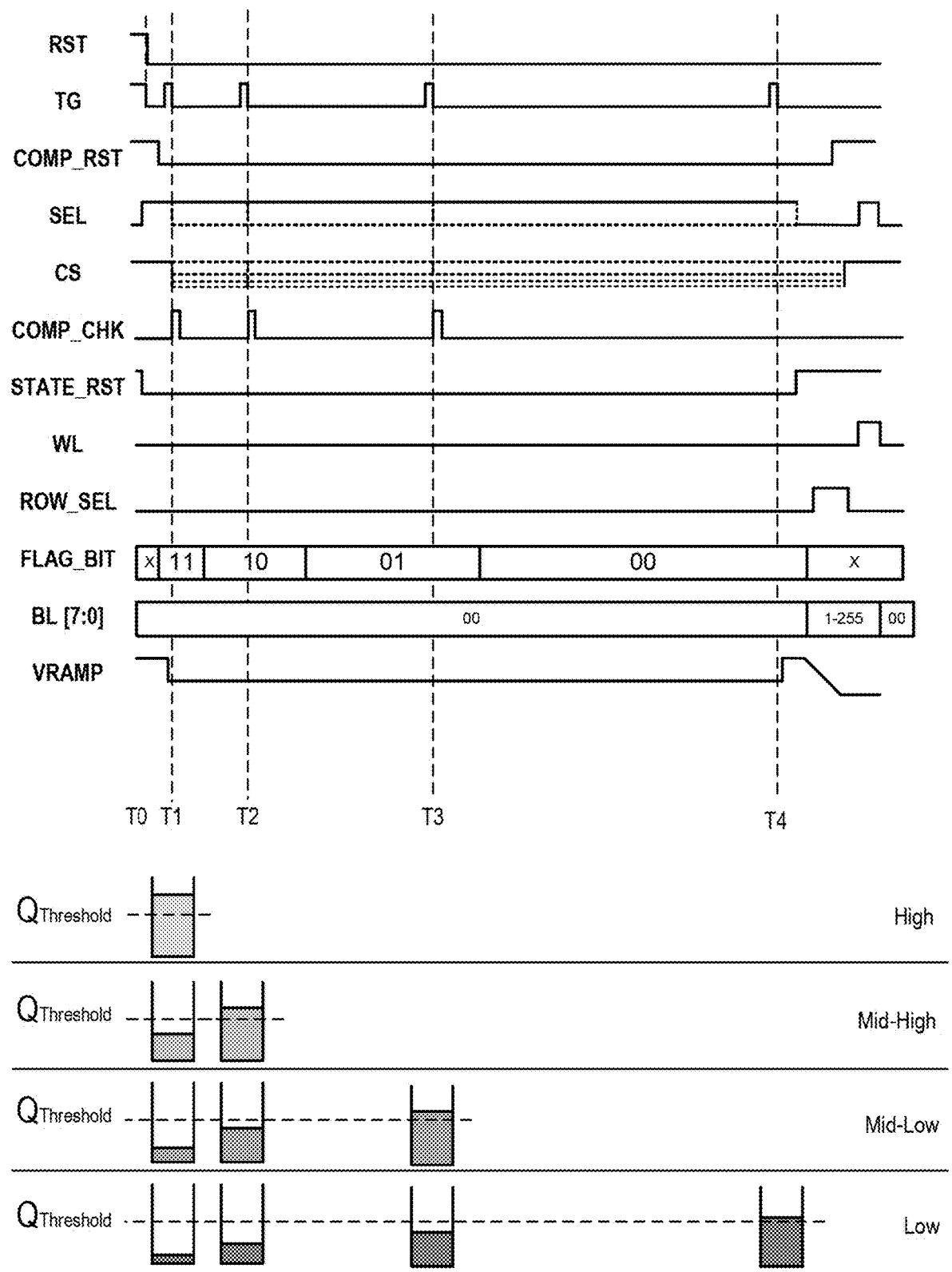
FIG. 7 illustrates a timing diagram depicting a time sequence of component activities during a capture time period.

FIG. 7 illustrates a timing diagram depicting a time sequence of component activities during a capture time period. Specifically, FIG. 7 depicts the timing signals of the components of the digital image sensor during the single quantization operations described herein. The timing diagram illustrated in FIG. 7 depicts the timing of the circuits in the digital image sensor at four distinct time periods occurring during an overall frame capture time period. For example, the timing diagram in FIG. 7 illustrates, four distinct time periods all with different durations: T1, T2, T3, and T4. As depicted in the timing diagram, these time periods correspond with a two-bit binary flag corresponding to a binary representation of the time period.

As illustrated in FIG. 7, depictions of example charge storage levels and timing information based on differing intensities of light is shown at each of the time periods. The timing diagram depicted in FIG. 7 begins following a reset of the circuit in a pixel-to-pixel sampling operation, in which the SOC pixel 500 and ASIC 510 processing circuit are reset after quantization of a previous digital pixel value and prior to a new frame capture depicted in FIG. 7.

The time period from the reset of the SOC pixel 500 and ASIC 510 to time T1 is the first time period of exposure for the digital pixel sensor. During this time period, the photodiode is exposed to light and the charge storage device converts the resulting generated charge into an analog voltage signal. After the reset occurs, the flag bit field indicating the time period of the frame capture is set to a null value (represented as "X") and then converted into a binary value representing the time period. For example, as depicted in the timing diagram, the flag bit field value is converted to a binary value of "11," representing a base ten value of 3 (out of a possible 3, 2, 1, and 0). The flag bit field is further converted to other corresponding binary values for subsequent time periods, as depicted in FIG. 7. For example, at the second time period, the flag bit field is converted to the binary value of "10," at the third time period, the flag bit field is converted to the binary value of "01," and at the fourth time period, the flag bit field is converted to the binary value of "00." The pixel values and the corresponding flag bit field values may then be stored and used later to generate a final pixel value.

As the timing diagram proceeds through the time periods T1-T4, the charge storage device will accumulate and convert a voltage signal corresponding to the charge generated by the photodiode. Because the photodiode may not generate as strongly of a change in low-light-intensity environments, the charge storage device may not store sufficient charge to accurately be quantized until the photodiode has been exposed to light for a long enough period of time, which will depend on the intensity of light received at the photodiode. For example, the dotted lines of the timing diagram for component CS represent different example states of charge captured based on the intensity of light received at the photodiode.

For example, when the photodiode is generating a charge from a "High" intensity source of light, as depicted in FIG. 7, the charge storage device may store a charge having a value greater than the threshold voltage value (depicted at $Q_{Threshold}$) before the first time period of measurement (as measured at T1). For example, as depicted in the row labelled "High" in FIG. 7, a charge storage device (depicted in FIG. 7 as a well storing a charge) that has been storing charge generated by a photodiode subject to a high intensity light may already have stored sufficient voltage (or may even have saturated) prior to time T1. This is depicted in the corresponding charge level of the storage well where the level of voltage captured exceeds the $Q_{Threshold}$ line. Because the charge storage device in the "High" intensity example has already generated sufficient charge for quantization when measured at T1 (for example, by comparator 512), the corresponding flag bit field of "11" at T1 may be latched stored in the memory 516. The circuit may be opened to prevent further generation of a charge in the charge storage device to save power and prevent saturation of the charge storage device. At the end of the exposure period, the stored charge is sent to the ADC to be quantized into a digital value and then stored in memory 516. Thus, at the end of the exposure period, both the flag bit value and the quantized pixel value are stored together in memory 516.

Other intensities of light received at the photodiode may mean that the charge storage device may need to be further exposed to generate a sufficient amount of charge in the charge storage device for accurate quantization. For example, if the source of light is instead a "mid-high" intensity source of light, the charge storage device may convert and store a voltage charge by time T1 that does not meet or exceed the threshold voltage value (represented by the well storing a charge at T1 that does not meet the $Q_{Threshold}$ line). The charge storage device may later convert and store sufficient charge to exceed the threshold voltage value by the time the end of time period T2 arrives, at which point the charge storage device has stored sufficient charge from the photodiode receiving the light into a voltage value that meets or exceeds the $Q_{Threshold}$ value. At time T2, the flag bit field is "10," representing the second time period during which the charge storage device has stored sufficient charge to meet or exceed the threshold when capturing the "Mid-High" intensity light.

Even less intense lights received at a photodiode may require further exposure time to convert and store, by the charge storage device, a sufficient charge for quantization. For example, if the source of light is instead a "Mid-Low" intensity of light, the charge converted and stored prior to either of time periods T1 or T2 may not be sufficient for quantization (as represented by the corresponding wells of the charge storage device that have not met the $Q_{Threshold}$ value at those times). Instead, as depicted in FIG. 7, storage of sufficient charge occurs prior to time period T3. At time T3, the flag bit field is currently "01," representing the third time period during which the stored charge met or exceeded the threshold. The circuit will then be opened to prevent further generation of charge at the charge storage device and the flag bit value will be stored in SRAM. At the end of the exposure period, the charge signal will be sent to the ADC for quantization and storage as discussed above.

Very low intensity lights received at a photodiode may require the full exposure time of the frame capture to reach a sufficient converted and stored charge. In some cases, the pixel may not reach sufficient charge levels, even prior to the final time period (T4 in FIG. 7). For example, if the source of light is a "Low" intensity of light, the charge converted and stored may not be sufficient prior to time period T3 and may or may not be sufficient even prior to time period T4. For example, a dull red light captured by a photodiode may be cause conversion and storage of a sufficient charge some time prior to time period T4, but not before time period T3. At the time of T4, the flag bit field is "00," representing that the fourth time period has occurred. The storage charge is then quantized regardless of the sufficiency of the charge at this time period and both the quantized pixel value and the corresponding flag bit value are stored in memory 516. For example, even if the stored charge is not sufficient to reach the threshold voltage at the time period of T4 (e.g., the light received is so low intensity that the resulting pixel color will be very dim or black), the charge will still be quantized because there will be no further exposure time for the charge storage device during this particular frame capture.

Figure 8:
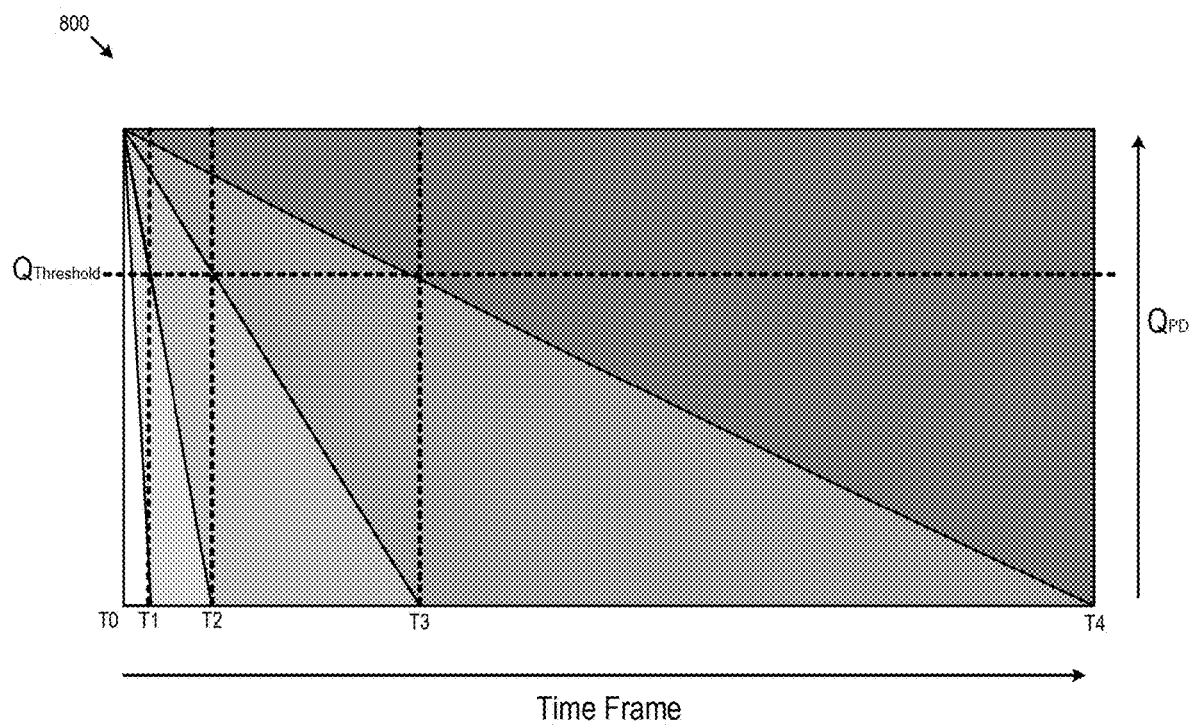
FIG. 8 illustrates a charge capture graph depicting a series of time-based saturation thresholds for various shades of light that generate a charge in a photodiode.

FIG. 8 illustrates a charge capture graph depicting a series of time-based charge sufficiency thresholds for various intensities of light that generate a charge in a photodiode. Specifically, FIG. 8 depicts a graph corresponding to what signal range/intensity corresponds to the four exposure time periods illustrated in FIG. 7. For example, the $Q_{Threshold}$ value continues to show the charge voltage threshold that is set at which a sufficient charge is expected to occur. The horizontal axis of the graph represents the time periods T1-T4 and their respective durations during the frame capture. The vertical axis shows the full capacity dynamic range of the photodiode $Q_{PD}$.

Figure 9:
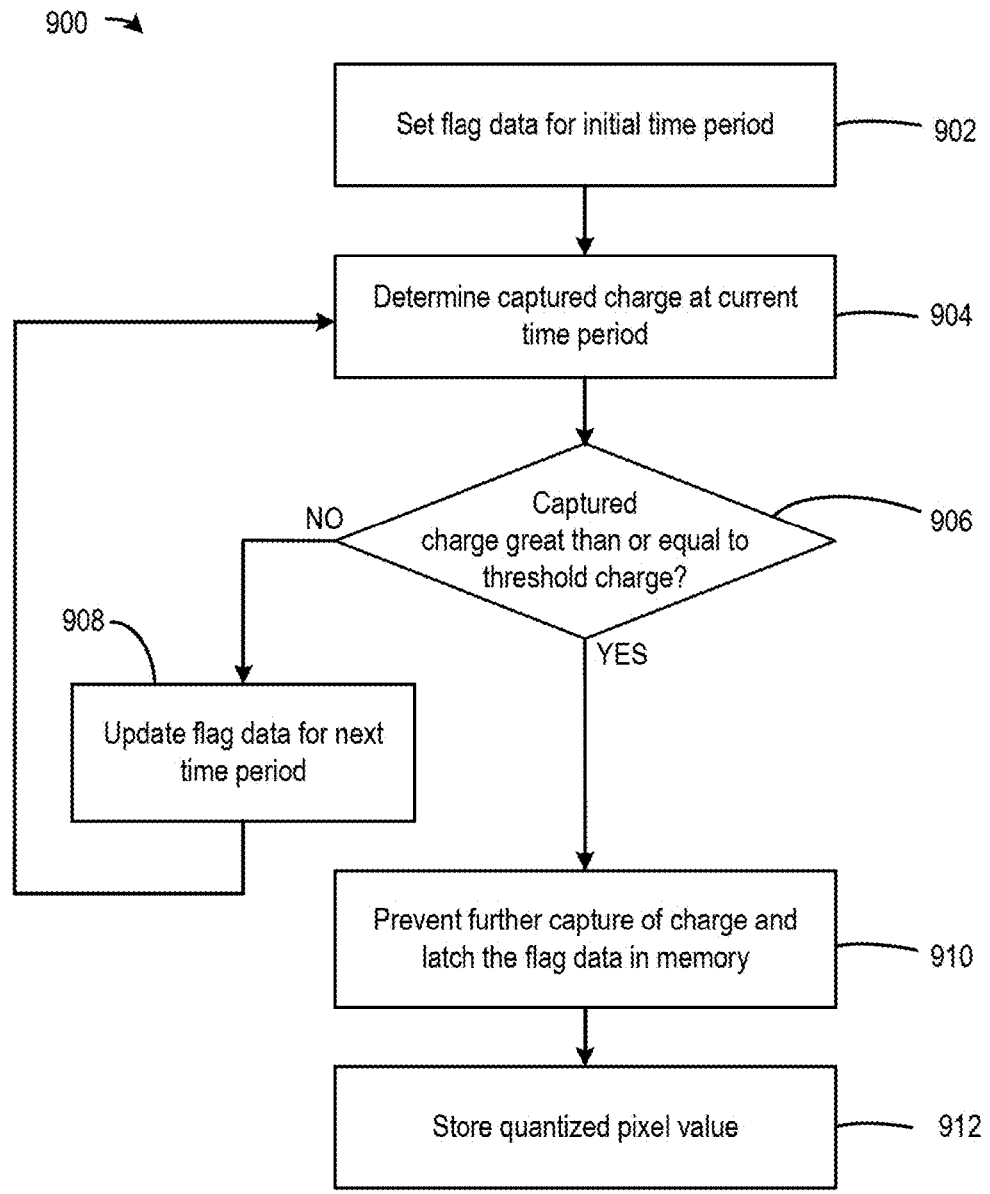
FIG. 9 illustrates an example process for quantizing digital pixel data using a single quantization based on time data and a saturated pixel charge.

FIG. 9 illustrates an example process for quantizing digital pixel data using a single quantization based on time data and a sufficient pixel charge meeting or exceeding a charge threshold. Specifically, FIG. 9 depicts a flowchart for converting a charge at a charge storage device to perform a single quantization operation as described herein. Process 900 may begin at 902, where flag data is set for an initial time period (e.g., the flag data is set to "11" in an example that employs a two-bit flag field configuration, such as illustrated in FIG. 7). The flag data corresponds to the initial period of time, e.g., $T_0$-$T_1$ in FIG. 7, over which exposure of a photodiode to light will occur.

In some embodiments, the flag data is captured by a state latch, such as state latch 514. For example, in response to a signal to reset the pixel sensor prior to a frame capture, state latch 514 may convert a currently existing flag bit field to a new binary flag bit field representing the initial time period for exposure. In some embodiments, the state latch 514 may first cause setting the flag bit field to a null value (e.g., "X" as depicted in FIG. 7) prior to setting the flag bit field to a first binary value representing the first time period.

At 904, following exposure of the photodiode to light during the then-current time period, the captured charge is determined for the current time period. For example, the photodiode 202 of an SOC pixel layer 500 may receive light from a light source to begin generation of a charge. The charge may be captured and converted to an analog voltage signal by a charge storage device, such as sampling capacitor 502. The charge storage device may be coupled to a logical component or circuit, such as comparator 512. Comparator 512 may be configured to determine a value of the captured charge as part of a comparison operation. In various embodiments, the ASIC 510 which includes the comparator 512 includes another capacitor or other charge storage device to obtain the sampled charge for comparing.

At 906, a determination is made as to whether the captured charge is greater than or equal to a threshold charge. For example, the comparator 512 of ASIC 510 compares the captured charge determined in 904 with a threshold charge received from another component such as ADC ramp generator 522. The threshold charge represents a voltage level of charge sufficient to provide a suitable signal-to-noise ratio of the light received by the photodiode using the voltage converted by the charge storage device. If the captured charge is not greater than or equal to the threshold charge, the charge storage device has not collected sufficient charge during the current exposure time. In such a case, the method 900 the proceeds to block 908. Otherwise, as will be discussed below, the method 900 proceeds to block 910.

At 908, following the determination that the captured charge is not greater than or equal to the threshold charge, the flag data is updated for the next time period. For example, in response to receiving a signal from the comparator 512 that the current captured voltage at the present time period does not meet or exceed the threshold voltage value, the state latch 514 may update the flag bit field to represent the next time period during which the comparator 512 will compare a captured charge value to the threshold value. In some embodiments, a component, such as state latch 514, may include binary arithmetic circuit that may decrement the flag data in response to receiving a signal from the comparator 512. The decrement operation would update the current time period flag by decrementing the binary value to represent that the next time period of exposure is about to occur.

In further embodiments, the indication that the captured charge does not meet or exceed the threshold voltage value represents that the latch will be kept closed so that the charge storage device may continue accumulating converted charge from the photodiodes until it has stored a sufficient charge for quantization. For example, state latch 514 may send or continue a signal to switch 518 that the latch shall remain closed such that the sampling capacitor 502 may continue to receive charge generated by the photodiode 202. Following 908, the process returns to 904, where, following additional exposure of the photodiode to light and the conversion of the charge in the charge storage device during the next time period, the captured charge is once again determined for the next time period.

If, at 906, it is determined that the captured charge is greater than or equal to the threshold charge, the process proceeds to 910, where further capture of charge is prevented and the flag data is stored in memory. For example, if the comparator 512 determines that the captured charge determined in 904 is greater than or equal to the threshold voltage value, the SEL signal may toggle and open switch 518 to prevent further accumulation of charge, which may reduce power consumption by the pixel. This occurs because the charge storage device has either reached a sufficient level of charge or the exposure period has ended. At this point, further exposure and conversion of charge at the charge storage device would either likely saturate the charge storage device or no further exposure time is available. Thus, when the captured charge in 910 is sufficient, the circuit connecting a charge storage device and a photodiode will be opened to prevent waste of power and undesired pixel saturation.

For example, preventing of the further capture of the charge at the charge storage device may be performed by opening a circuit through which the photodiode 202 is coupled to the sampling capacitor 502 or another capacitor in CDS embodiments (e.g., the CC). In this case, in response to receiving an input from the comparator 512 that the captured charge determined in 904 is greater than or equal to the threshold charge, the state latch 514 may update or generate a signal for the SEL circuit that will cause switch 518 to open. When switch 518 is open, the charge generated by the photodiode will no longer reach the charge storage device and the charges are no longer converted.

Once the capture of future charge had been prevented, the flag data is stored in memory as an indication of the time period at which the circuit was opened and further charge accumulation was prevented. For example, the state latch 514 may latch a two-bit binary flag-based value into a SRAM computer memory to represent the time period.

At 912, a quantized pixel value is stored. At the end of the exposure period, the accumulated charge is quantized and then stored in SRAM along with the flag bit value. These two values may then be later readout and used to construct an HDR image.

In an example embodiment, a photodiode of a pixel sensor is reset and begins to receive a moderate-intensity light during a frame capture. A flag bit field is set to the binary value of "11" indicating the first of four distinct time periods during the frame capture. A digital clock measures the time periods that have passed since the reset of the pixel sensor. When the clock indicates time period T1, a comparator may receive a reference voltage value and a stored charge value from a charge storage device that has been converting and storing charge received from the photodiode. The comparator may determine that the stored charge does not meet or exceed the threshold reference voltage value at time period T1. The comparator will send a signal to a latch to continue to keep the circuit closed so that the charge storage device may continue to accumulate charge. Sometime before time period T2, the flag bit field may be decremented to a value of "10."

When the digital clock indicates time period T2, the comparator may receive a reference voltage value and a stored charge value from the charge storage device. The comparator may determine that the stored charge now exceeds the threshold reference voltage value at time period T2. The comparator will send a signal to the latch to open the circuit between the charge storage device and the photodiode to prevent further accumulation of charge. Thus, the charge storage device will no longer consume unnecessary power converting charges from the photodiode and will prevent undesirable saturation of the charge storage device.

In addition, and the latch sends the current flag bit field to a memory such as a SRAM. But since the exposure period has not yet ended, the stored charge is not yet quantized. Instead, the remainder of the exposure period elapses, without further accumulation of charge occurring due to the opened switch. At the end of the exposure period, the stored charge is quantized and stored in the SRAM as well. Thus, both the quantized pixel value and the flag bit value corresponding to when the charge accumulation was halted are stored and available for subsequent readout.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may include a general-purpose computing device selectively activated or reconfigured by a computer program stored in the computer. Such a computer program may be stored in a non-transitory, tangible computer-readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may include information resulting from a computing process, where the information is stored on a non-transitory, tangible computer-readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A sensor apparatus comprising:
   a pixel cell configured to generate a voltages, the pixel cell including a photodiode configured to generate charge in response to incoming light, and a charge storage device to convert the charge to a voltage;
   an integrated circuit configured to:
      determine a first captured voltage converted by the charge storage device during a first time period;
      compare the first captured voltage to a threshold voltage value; and
      in response to determining that the first captured voltage meets or exceeds the threshold voltage value:
         determine first time data corresponding to the first time period; and
         prevent the charge storage device from further generating a charge;
   and
      an analog-to-digital converter (ADC) configured to generate a digital pixel value based on the first captured voltage, and
      a memory to store the digital pixel value and the first time data.

2. The apparatus of claim 1, wherein the integrated circuit comprises a latch, and the photodiode of the pixel cell is coupled to the charge storage device of the pixel cell via the latch.

3. The apparatus of claim 2, wherein the latch enables the charge storage device to accumulate charge when the latch is closed, and the latch prevents the charge storage device from accumulating charge when the latch is open.

4. The apparatus of claim 3, wherein the integrated circuit comprises a comparator configured to receive the first captured voltage from the charge storage device and compare the first captured voltage to the threshold voltage value.

5. The apparatus of claim 4, wherein the comparator is further configured to output a comparison signal to the latch, wherein the latch is opened in response to receiving a signal from the comparator indicating the first captured voltage from the charge storage device meets or exceeds the threshold voltage value.

6. The apparatus of claim 1, further comprising one or more sense amplifiers configured to process the digital pixel value to generate an amplified value prior to exporting the amplified value off of the apparatus.

7. The apparatus of claim 1, wherein the first time data is a binary flag field configured to represent a plurality of time periods including the first time period and at least a second time period.

8. The apparatus of claim 7, wherein the plurality of time periods are determined based on a type of the photodiode, the type of the photodiode indicating a rate of charge generation based on incoming light intensity.

9. The apparatus of claim 8, wherein the plurality of time periods are determined based on a target dynamic range of the sensor apparatus.

10. The apparatus of claim 7, wherein:
    the second time period occurs prior to the first time period;
    the integrated circuit is further configured to determine a second captured voltage converted by the charge storage device at the second time period.

11. The apparatus of claim 10, wherein the integrated circuit is further configured to compare the second captured voltage converted by the charge storage device at the second time period to the threshold voltage value.

12. The apparatus of claim 11, wherein the integrated circuit is configured to, in response to determining that the second captured voltage does not meet or exceed the threshold voltage value, update the binary flag field.

13. The apparatus of claim 12, wherein the binary flag field is a one-bit binary flag corresponding to the first and second time periods.

14. The apparatus of claim 12, wherein the binary flag field is a two-bit binary flag corresponding to the first and second time periods and a third and fourth time period, the third and fourth time period occurring subsequent to the first time period.

15. The apparatus of claim 1, wherein the integrated circuit is further configured to receive the threshold voltage value prior to comparing the first captured voltage to the threshold voltage value.

16. The apparatus of claim 15, wherein the integrated circuit receives the threshold voltage value from an ADC ramp generator.

17. The apparatus of claim 16, wherein:
    the sensor apparatus further comprises an integrated circuit periphery coupled to the integrated circuit;
    the integrated circuit periphery comprises the ADC ramp generator;
    the ADC ramp generator in configured to determine the threshold voltage value based on a ramp input received at the ADC ramp generator.

18. The apparatus of claim 17, wherein the integrated circuit periphery is further coupled to an application instance, the application instance configured to:
    determine the ramp input based on one or more features of a scene; and
    send the ramp input to the ADC ramp generator.

19. The apparatus of claim 18, wherein the one or more features of a scene are generated based on one or more of an environmental sensor, a motion sensor, and a generative model.

20. A method comprising:
    generating a voltage by converting charges based on incoming light received at a photodiode;
    determining a first captured voltage generated during a first time period;
    comparing the first captured voltage to a threshold voltage value;

in response to determining that the first captured voltage meets or exceeds the threshold voltage value:
    determining first time data corresponding to the first time period;
    storing the first time data in memory; and
    preventing further accumulation of charge;
converting the first captured voltage to digital pixel data comprising one or more digital pixel values; and
storing the digital pixel data in the memory.

* * * * *